United States Patent
Prasad et al.

(10) Patent No.: US 12,014,927 B2
(45) Date of Patent: *Jun. 18, 2024

(54) HIGHLY ETCH SELECTIVE AMORPHOUS CARBON FILM

(71) Applicant: Applied Materials, Inc., Santa Clara, CA (US)

(72) Inventors: Rajesh Prasad, Gloucester, MA (US); Sarah Bobek, Sunnyvale, CA (US); Prashant Kumar Kulshreshtha, San Jose, CA (US); Kwangduk Douglas Lee, Redwood City, CA (US); Harry Whitesell, Sunnyvale, CA (US); Hidetaka Oshio, Tokyo (JP); Dong Hyung Lee, Danville, CA (US); Deven Matthew Raj Mittal, Middleton, MA (US); Scott Falk, Essex, MA (US); Venkataramana R. Chavva, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/963,841

(22) Filed: Oct. 11, 2022

(65) Prior Publication Data
US 2023/0041963 A1 Feb. 9, 2023

Related U.S. Application Data

(63) Continuation of application No. 16/939,316, filed on Jul. 27, 2020, now Pat. No. 11,469,107, which is a
(Continued)

(51) Int. Cl.
*H01L 21/033* (2006.01)
*C23C 16/26* (2006.01)
(Continued)

(52) U.S. Cl.
CPC .......... *H01L 21/0338* (2013.01); *C23C 16/26* (2013.01); *C23C 16/505* (2013.01);
(Continued)

(58) Field of Classification Search
None
See application file for complete search history.

(56) References Cited

U.S. PATENT DOCUMENTS

| 6,750,127 B1 | 6/2004 | Chang et al. |
| 6,884,733 B1 | 4/2005 | Dakshina-Murthy et al. |
| (Continued) | | |

FOREIGN PATENT DOCUMENTS

| CN | 103210480 A | 7/2013 |
| JP | 2004-249493 A | 9/2004 |
| (Continued) | | |

OTHER PUBLICATIONS

International Search Report and Written Opinion for International Application No. PCT/US2018/060628 dated Mar. 6, 2019.
(Continued)

*Primary Examiner* — Asok K Sarkar
(74) *Attorney, Agent, or Firm* — Patterson + Sheridan, LLP

(57) ABSTRACT

Methods and techniques for deposition of amorphous carbon films on a substrate are provided. In one example, the method includes depositing an amorphous carbon film on an underlayer positioned on a susceptor in a first processing region. The method further includes implanting a dopant or the inert species into the amorphous carbon film in a second processing region. The implant species, energy, dose & temperature in some combination may be used to enhance the hardmask hardness. The method further includes patterning the doped amorphous carbon film. The method further includes etching the underlayer.

20 Claims, 7 Drawing Sheets

Related U.S. Application Data continuation-in-part of application No. 16/188,514, filed on Nov. 13, 2018, now Pat. No. 10,727,059.

(60) Provisional application No. 62/593,668, filed on Dec. 1, 2017.

(51) Int. Cl.
| | |
|---|---|
| *C23C 16/505* | (2006.01) |
| *C23C 16/56* | (2006.01) |
| *H01L 21/02* | (2006.01) |
| *H01L 21/311* | (2006.01) |
| *H01L 21/3115* | (2006.01) |

(52) U.S. Cl.
CPC ........ *C23C 16/56* (2013.01); *H01L 21/02115* (2013.01); *H01L 21/02274* (2013.01); *H01L 21/02321* (2013.01); *H01L 21/0234* (2013.01); *H01L 21/0332* (2013.01); *H01L 21/0335* (2013.01); *H01L 21/0337* (2013.01); *H01L 21/31122* (2013.01); *H01L 21/31155* (2013.01)

(56) References Cited

U.S. PATENT DOCUMENTS

| | | | |
|---|---|---|---|
| 7,312,162 B2 | 12/2007 | Ramaswamy et al. | |
| 8,361,906 B2 | 1/2013 | Lee et al. | |
| 8,536,065 B2 | 9/2013 | Seamons et al. | |
| 8,993,454 B2 | 3/2015 | Seamons et al. | |
| 9,390,910 B2 | 7/2016 | Kulshreshtha et al. | |
| 9,412,613 B2 | 8/2016 | Manna et al. | |
| 9,711,360 B2 | 7/2017 | Duan et al. | |
| 9,721,784 B2 | 8/2017 | Behera et al. | |
| 9,748,148 B2 | 8/2017 | Meh et al. | |
| 10,074,534 B2 | 9/2018 | Behera et al. | |
| 10,128,197 B2 | 11/2018 | Ranish et al. | |
| 10,727,059 B2 * | 7/2020 | Bobek ................. C23C 16/56 | |
| 11,049,728 B2 | 6/2021 | Uvais et al. | |
| 11,469,107 B2 * | 10/2022 | Prasad ................ H01L 21/0332 | |
| 2004/0200417 A1 | 10/2004 | Hanawa et al. | |
| 2006/0264060 A1 | 11/2006 | Ramaswamy et al. | |
| 2008/0220257 A1 * | 9/2008 | Dekempeneer ....... C23C 28/343 428/408 |
| 2009/0093128 A1 | 4/2009 | Seamons et al. | |
| 2011/0230030 A1 | 9/2011 | De Souza et al. | |
| 2011/0287633 A1 | 11/2011 | Lee et al. | |
| 2012/0080779 A1 | 4/2012 | Seamons et al. | |
| 2013/0199925 A1 | 8/2013 | Cao et al. | |
| 2013/0302996 A1 | 11/2013 | Reilly et al. | |
| 2014/0017897 A1 | 1/2014 | Seamons et al. | |
| 2014/0273461 A1 | 9/2014 | Lee et al. | |
| 2015/0013910 A1 | 1/2015 | Krupyshev et al. | |
| 2015/0194317 A1 | 7/2015 | Manna et al. | |
| 2016/0005596 A1 | 1/2016 | Behera et al. | |
| 2016/0194758 A1 | 7/2016 | Nemani et al. | |
| 2017/0103893 A1 | 4/2017 | Kulshreshtha et al. | |
| 2017/0133328 A1 | 5/2017 | Ranish et al. | |
| 2017/0301537 A1 | 10/2017 | Behera et al. | |
| 2018/0105421 A1 | 4/2018 | Polcik et al. | |
| 2018/0261431 A1 | 9/2018 | Hammond, IV et al. | |
| 2019/0172714 A1 | 6/2019 | Bobek et al. | |
| 2020/0135485 A1 | 4/2020 | Uvais et al. | |
| 2020/0357640 A1 | 11/2020 | Prasad et al. | |

FOREIGN PATENT DOCUMENTS

| | | | |
|---|---|---|---|
| JP | 2008-540849 A | 11/2008 | |
| JP | 2009-135439 A | 6/2009 | |
| JP | 2011-207223 A | 10/2011 | |
| JP | 2016-513883 A | 5/2016 | |
| JP | 2017-507477 A | 3/2017 | |
| JP | 2018-536990 A | 12/2018 | |
| KR | 20130118880 A | 10/2013 | |
| KR | 20150007287 A | 1/2015 | |
| KR | 20160105896 A | 9/2016 | |
| TW | 201216331 A | 4/2012 | |
| TW | 201528334 A | 7/2015 | |
| TW | 201610203 A | 3/2016 | |
| TW | 201718918 A | 6/2017 | |
| WO | 2014/188710 A1 | 11/2014 | |
| WO | 2015-105651 A1 | 7/2015 | |

OTHER PUBLICATIONS

Office Action for U.S. Appl. No. 16/188,514 dated Oct. 21, 2019.
International Search Report and Written Opinion dated Nov. 5, 2021 for Application No. PCT/US2021/042466.
Taiwan Office Action dated May 5, 2022 for Application No. 107140950.
Office Action for Korean Application No. 10-2020-7018768 dated Mar. 22, 2023.
Office Action for Japanese Application No. 2020-529688 dated Feb. 7, 2023.
Office Action for Taiwan Application No. 112100073 dated Sep. 12, 2023.
Search Report for Taiwan Application No. 112100073 dated Sep. 12, 2023.
Chinese Office Action dated Jan. 15, 2024 for Application No. 201880084977.2.
Office Action for Taiwan Application No. 112100073 dated Feb. 26, 2024.

\* cited by examiner

HIGHLY ETCH SELECTIVE AMORPHOUS CARBON FILM

CROSS-REFERENCE TO RELATED APPLICATIONS

This application is a continuation of U.S. patent application Ser. No. 16/939,316, filed Jul. 27, 2020, which is a continuation-in-part of U.S. patent application Ser. No. 16/188,514, filed Nov. 13, 2018, which claims benefit of U.S. Pat. Appl. No. 62/593,668, filed Dec. 1, 2017, each of which are incorporated herein by reference in their entirety.

BACKGROUND

Field

Implementations described herein generally relate to the fabrication of integrated circuits. More particularly, the implementations described herein provide techniques for deposition of amorphous carbon films on a substrate.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, low resistivity conductive materials as well as low dielectric constant insulating materials are used to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers deposited on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are desirable. As critical dimensions (CD) decrease, current hardmask materials lack the targeted etch selectivity relative to underlying materials (e.g., oxides and nitrides) and are often difficult to deposit.

Therefore, there is a need in the art for an improved hardmask layer and methods for depositing improved hardmask layers.

SUMMARY

Implementations described herein generally relate to the fabrication of integrated circuits. More particularly, the implementations described herein provide techniques for deposition of amorphous carbon films on a substrate. In one implementation, a method of forming an amorphous carbon film is provided. The method includes depositing an amorphous carbon film on an underlayer positioned on a susceptor in a first processing region. The method further includes forming a doped amorphous carbon film by implanting a dopant or inert species into the amorphous carbon film in a second processing region. The dopant or inert species is selected from carbon, boron, nitrogen, nitrogen dimer, silicon, phosphorous, argon, helium, neon, krypton, xenon or combinations thereof. The method further includes patterning the doped amorphous carbon film and etching the underlayer.

In another implementation, a method of forming an amorphous carbon film is provided. The method includes depositing an amorphous carbon film on an underlayer positioned on a susceptor in a first processing region. The method further includes forming a doped amorphous carbon film by implanting a dopant into the amorphous carbon film in a second processing region. The dopant or inert species is selected from carbon, boron, nitrogen, nitrogen dimer silicon, phosphorous, argon, helium, neon, krypton, xenon or combinations thereof. The method further includes patterning the doped amorphous carbon film. The method further includes etching the underlayer, wherein the doped amorphous carbon film has a refractive index at 633 nm of from about 2.1 to about 2.2.

In yet another implementation, a hardmask layer comprising an amorphous carbon film is provided. The amorphous carbon film is formed by a plasma enhanced chemical vapor deposition process followed by a carbon implantation process. The dopant or inert species is selected from carbon, boron, nitrogen, nitrogen dimer, silicon, phosphorous, argon, helium, neon, krypton, xenon or combinations thereof. The amorphous carbon film serves as a hardmask layer in an etching process for use in semiconductor applications.

In yet another implementation, a method of forming an amorphous carbon film is provided. The method includes depositing an amorphous carbon film on an underlayer positioned on a susceptor in a first processing region. The method further includes forming a doped amorphous carbon film by implanting a dopant or an inert species into the amorphous carbon film in a second processing region. The dopant or the inert species is selected from carbon, boron, nitrogen, silicon, phosphorous, argon, helium, neon, krypton, xenon, beryllium, germanium, or a combination thereof, wherein a target temperature during implanting the dopant or the inert species is between about −100 degrees Celsius and about 550 degrees Celsius. The method further includes patterning the doped amorphous carbon film and etching the underlayer.

In yet another implementation, a method of forming an amorphous carbon film is provided. The method includes depositing an amorphous carbon film on an underlayer positioned on a susceptor in a first processing region. The method further includes forming a doped amorphous carbon film by implanting a dopant or an inert species into the amorphous carbon film in a second processing region. The dopant or the inert species is selected from carbon, boron, nitrogen, silicon, phosphorous, argon, helium, neon, krypton, xenon, beryllium, germanium, or a combination thereof, wherein a target temperature during implanting the dopant or the inert species is between about −100 degrees Celsius and about 550 degrees Celsius. The method includes patterning the doped amorphous carbon film and etching the underlayer, wherein the doped amorphous carbon film has a refractive index at 633 nm of from about 2.1 to about 2.2.

In yet another implementation, a method of forming an amorphous carbon film is provided. The method includes depositing an amorphous carbon film on an underlayer positioned on a susceptor in a first processing region. The method further includes forming a doped amorphous carbon film by implanting a carbon dopant into the amorphous carbon film in a second processing region, wherein a target temperature during implanting the carbon dopant is between about −100 degrees Celsius and about 550 degrees Celsius. The method further includes patterning the doped amorphous carbon film and etching the underlayer, wherein the doped amorphous carbon film has a hardness (GPa) of from about 14 GPa to about 22 GPa.

In yet another implementation, a method of forming an amorphous carbon film is provided. The method includes depositing an amorphous carbon film on an underlayer positioned on a susceptor in a first processing region. The method further includes patterning the amorphous carbon layer. The method further includes forming a doped patterned doped amorphous carbon film by implanting a dopant or inert species into the patterned amorphous carbon film in a second processing region. The dopant or inert species is selected from carbon, boron, nitrogen, silicon, phosphorous, argon, helium, neon, krypton, xenon, beryllium, germanium, or a combination thereof, wherein a target temperature during implanting the dopant or the inert species is between about −100 degrees Celsius and about 550 degrees Celsius. The method further includes etching the underlayer.

In yet another implementation, a method of forming an amorphous carbon film is provided. The method includes depositing an amorphous carbon film on an underlayer positioned on a susceptor in a first processing region. The method further includes patterning the amorphous carbon layer. The method further includes forming a doped patterned amorphous carbon film by implanting a dopant or an inert species into the patterned amorphous carbon film in a second processing region. The dopant or the inert species is selected from carbon, boron, nitrogen, silicon, phosphorous, argon, helium, neon, krypton, xenon, beryllium, germanium, or a combination thereof, wherein a target temperature during implanting the dopant or the inert species is between about −100 degrees Celsius and about 550 degrees Celsius. The implant can be done at a tilt angle of 0 degrees with a specific species that enables increasing the etch rate of the underlayer or at a tilt angle between 0.1 degrees and 80 degrees, with an associated twist angle between 0 and 360 degrees. The associated tilt angle enables the ions to only penetrate the hardmask due to the nature of the species that may result in decreasing the underlayer etch rate. For a carbon hardmask line and space feature that runs in one direction and not two perpendicular directions, the implantation can be divided into two separate implants, with each implant at one half of the desired dose, for example, a dose of $1.0 \times 10^{16}$ ions/cm$^2$ becomes a dose of $5.0 \times 10^{15}$ ions/cm$^2$. The substrate sees implantation every 180 degrees rotation thus building up to the desired dose of $1.0 \times 10^{16}$ ions/cm$^2$. As a result, both sides of the carbon hardmask feature are implanted uniformly. The method can further include doping the patterned undoped amorphous carbon film and etching the underlayer, wherein the doped amorphous carbon film has a refractive index at 633 nm of from about 2.1 to about 2.2.

In yet another implementation, a method of forming an amorphous carbon film is provided. The method includes depositing an amorphous carbon film on an underlayer positioned on a susceptor in a first processing region. The method further includes patterning the amorphous carbon film. The method further includes forming a doped patterned amorphous carbon film by implanting a carbon dopant into the patterned amorphous carbon film in a second processing region, wherein a target temperature during implanting the carbon dopant is between about −100 degrees Celsius and about 550 degrees Celsius. The method further includes etching the underlayer, wherein the doped patterned amorphous carbon film has a hardness (GPa) of from about 14 GPa to about 22 GPa.

In yet another implementation, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
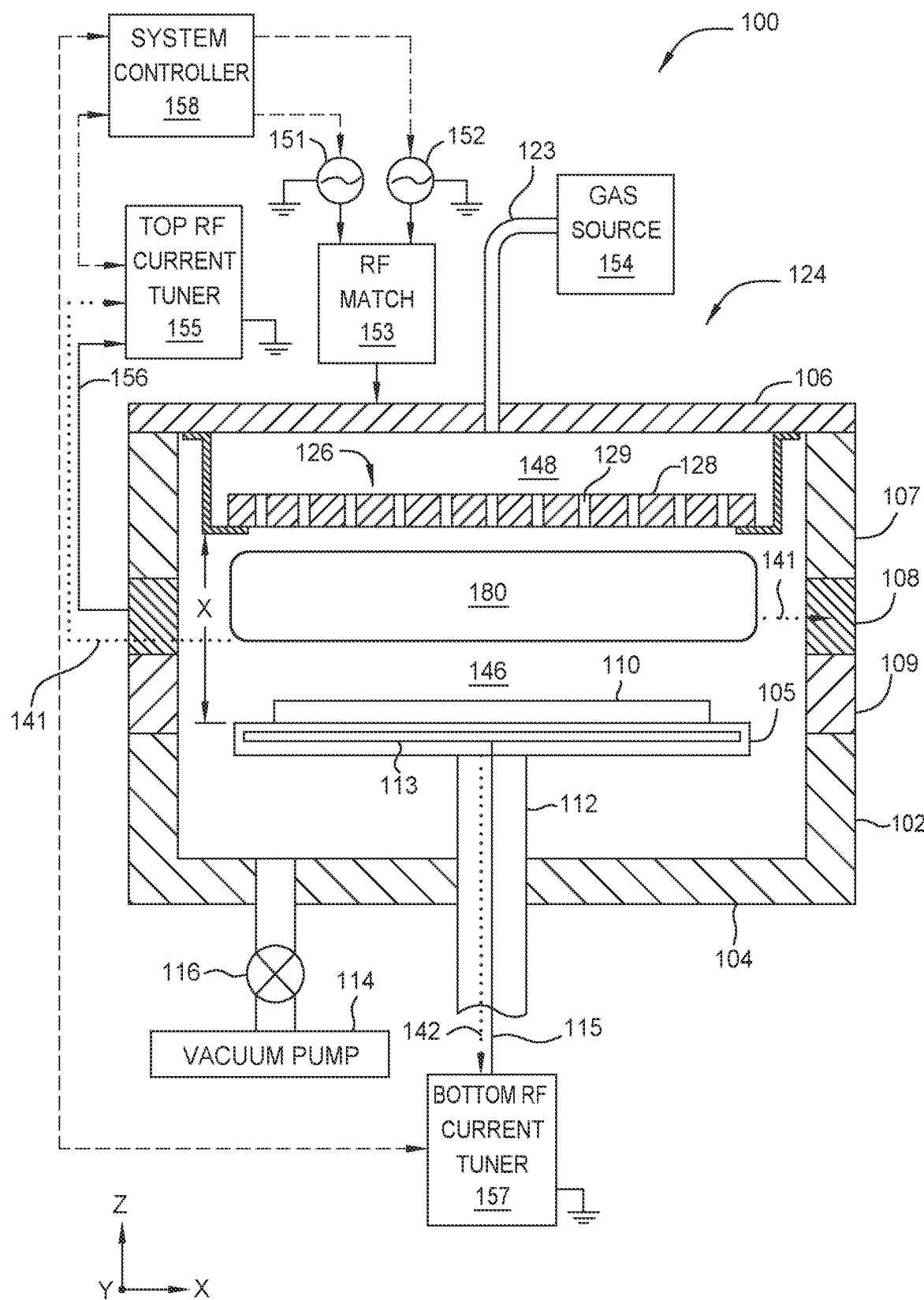
FIG. 1 depicts a schematic illustration of an apparatus that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for deposition of diamond-like carbon films on a substrate. Certain details are set forth in the following description and in FIGS. 1-7I to provide a thorough understanding of various implementations of the disclosure. Other details describing well-known structures and systems often associated with plasma-processing and ion implantation are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD deposition process and an ion implantation process that can be carried out using any suitable thin film deposition and implant systems. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. The ion implantation process may be performed by a beam-line or plasma implantation tools. Exemplary systems utilized to perform the implantation process include, for example, the VARIAN VIISta® TRIDENT system, VARIAN VIISta® Thermion system, VARIAN VIISta® medium current Thermion system, VIISta® 3000XP system, VIISta® 900XP system, VIISta® HCP system, VIISta® Trident Crion™ system and the VIISta® PLAD system, available from Applied Materials, Inc., Santa Clara, Calif. Other tools capable of performing PECVD and/or ion implantation processes may also be adapted to benefit from the implementations described herein. In addition, any system enabling the PECVD and/or ion implant processes described herein can be used to advantage. The apparatus description described herein is illustrative and should not be construed or interpreted as limiting the scope of the implementations described herein.

The physical constraints in scaling down of integrated circuits have resulted in extension of integrated circuits orthogonal to the planar wafer surface, i.e., high aspect ratio (HAR), three-dimensional utilization of device space. The nanofabrication strategies to accommodate dynamic etch selectivity and increasingly stringent fabrication tolerances have resulted in a library of hardmask (HM) materials, such as carbon films doped with silicon, titanium, tungsten or boron; as well as dielectric silicon oxide-nitride (ON/OP) films. Used in combination, these materials offer advantages in etch selectivity and patterning down to the 1× node. Innovation in amorphous carbon hardmask materials is desirable for achieving high aspect ratio (HAR) benchmarks in next generation device structures. In contrast to metal and dielectric solutions, amorphous carbon is ashable, providing high selectivity with respect to underlying ON/OP hardmask films. Another benefit of amorphous carbon hardmasks is the corresponding optical properties of the amorphous carbon hardmasks, which are tunable to offer transparency to aligned patterned features, therefore eliminating the need of partial hard mask open process. However, current integrated hardware and processes for amorphous carbon hardmasks demonstrate comparatively poor mechanical properties relative to metal doped and dielectric hardmask counterparts. The highest etch selectivity for the current generation pure carbon films (e.g., nanocrystalline diamond, ultra-nanocrystalline diamond, diamond-like carbon, and physical vapor deposition carbon) is seen for films with high sp3 content, analogous to the hybridization of diamond. A long-standing high value problem in diamond like carbon hardmasks is the >1 GPa compressive film stress due to sp3 hybridized carbon, which limits patterning performance due to lithographic overlay and electrostatic chucking constraints.

Next generation 3D NAND products with 64× layer stack applications and aspect ratios of 100:1 demand thin films that allow patterning while resisting deformation and simultaneously demonstrating improved lithographic overlay. Diamond-like carbon films couple carbon species-specific etch selectivity with superior structural integrity. These diamond-like carbon films will remain competitive only if their mechanical properties, the harbinger of which is Young's modulus, can further improve at reduced stress and in-plane distortion ("IPD") values.

Some implementations of the present disclosure provide processes that use existing hardware with little impact to throughput or implementation cost. Some implementations of the present disclosure solve the high value problems of lithographic overlay, and high stress in conjunction with poor Young's modulus (E). Some implementations of the present disclosure provide a unique process that increases the modulus of amorphous carbon by about 2× (e.g., from about 64 GPa to about 138 GPa) by tuning of the plasma deposition mechanism. Further improvement of film properties is achieved through ion-implantation, which increases the Young's modulus of the amorphous carbon film an additional 30% (~180 GPa) while decreasing compressive stress by 75% (from about −1200 to about −300 MPa). In addition, the combination of PECVD plus ion implantation delivered amorphous carbon films that achieved significantly lower in-plane distortion (<3 nanometers overlay error) compared to the current generation of pure carbon hardmask films.

In improving performance of amorphous carbon hardmask films, the first aspect of the present disclosure defines a new process window. This new process window targets low in-plane distortion despite high stress (e.g., about −1200 GPa), yet improved modulus. Not to be bound by theory but it is believed that these improvements are achieved by increasing the sheath size of the plasma through decreasing pressure, and increasing process spacing resulting in a decreased plasma temperature. Higher sheath potential and Bohm velocity was confirmed by a marked decrease in deposition rate, despite decreasing synthesis temperature. This favors more formation of carbon-to-carbon bonding while reducing hydrogen content in the film. In one implementation, the measured extinction coefficient values at 633 nm post deposition was 0.72, indicating a higher C=C, graphitic character. Furthermore, decreasing the density of the plasma increased the mean free path, the bombardment energy and improved the uniformity of the ion energy distribution function across the wafer surface. In-film properties because of weaker plasma, which minimized amorphization by bombardment, show an increase in Young's modulus (E), hardness, and density. Not to be bound by theory, but it is believed that the increased mean free path results in a lower in-plane distortion (IPD), which is targeted for lithographic overlay.

A second aspect of the present disclosure, in-line ion implantation, serves to diminish the stress component of the amorphous carbon film by up to approximately 75% (e.g., from about −1200 to about −300 MPa), further improve the Young's modulus (e.g., from about 138 to about 177 GPa) and make more centrosymmetric the in-plane distortion profile. Ion implantation may be performed at a range of temperatures (e.g., from about −100 degrees Celsius to about 550 degrees Celsius). It is established herein that decreasing the ion implantation temperature for amorphous carbon films minimizes the rearrangement of implanted dopants—confirming the beneficial effects of implantation such as densification, sp3 enhancement, and hydrogen reduction. Not to be bound by theory, but it is believed that the ion implantation redistributes local stresses and helps to reduce overall wafer stress to, for example, about 25% of the post-film deposition value. The correct process regime for implantation, to best enhance modulus while reducing stress is developed based on the incoming wafer modulus to bypass the HVP of saturation of the film improvement.

The resulting amorphous carbon film has shown an improvement in etch selectivity of 30-50% compared to currently available pure carbon hardmask films, while also matching the previous overlay requirements.

In some implementations of the present disclosure, amorphous carbon films were deposited via plasma enhanced chemical vapor deposition onto bare silicon blanket wafers. In some implementations, the carbon precursor is $C_3H_6$, with plasma profile and uniformity sustained by argon and helium gases. The scope of this work also encompasses use of $C_4H_8$, $C_2H_6$, $C_2H_4$, $C_2H_2$, $CO_2$ and $CF_4$, among others. High frequency RF for this application is 13.56 MHz. The single wafer hardware enables deposition up to temperatures of 650 degrees Celsius, and maintains plasma stability from center to edge using a gas box, showerhead combination with planar heater-edge ring configuration. The plasma profile and coupling to the wafer surface may be further tuned by layering of RF for distribution laterally and orthogonally to the wafer surface.

In some implementations, ion implantation is executed in a single-wafer processing tool. A heat exchanger enables temperature control and development of cold implant techniques to −100 degrees Celsius. The species yielding high performance shown in the present disclosure is an ashable ion, maintaining the pure carbon character of the films.

FIG. 1 is a schematic cross sectional view of a plasma-processing chamber 100 configured according to various implementations of the disclosure. By way of example, the implementation of the plasma-processing chamber 100 in FIG. 1 is described in terms of a PECVD system, but any other plasma-processing chamber may fall within the scope of the implementations, including other plasma deposition chambers or plasma etch chambers. The plasma-processing chamber 100 includes walls 102, a bottom 104, and a chamber lid 124 that together enclose a susceptor 105 and a processing region 146. The plasma-processing chamber 100 further includes a vacuum pump 114, a first RF generator 151, a second RF generator 152, an RF match 153, a gas source 154, a top RF current tuner 155, a bottom RF current tuner 157, and a system controller 158, each coupled externally to the plasma-processing chamber 100 as shown.

The walls 102 and the bottom 104 may comprise an electrically conductive material, such as aluminum or stainless steel. Through one or more of the walls 102, a slit valve opening may be present that is configured to facilitate insertion of a substrate 110 into and removal of the substrate 110 from the plasma-processing chamber 100. A slit valve configured to seal slit valve opening may be disposed either inside or outside of the plasma-processing chamber 100. For clarity, no slit valve or slit valve opening is shown in FIG. 1.

The vacuum pump 114 is coupled to the plasma-processing chamber 100 and is configured to adjust the vacuum level therein. As shown, a valve 116 may be coupled between the plasma-processing chamber 100 and the vacuum pump 114. The vacuum pump 114 evacuates the plasma-processing chamber 100 prior to substrate processing and removes process gas therefrom during processing through the valve 116. The valve 116 may be adjustable to facilitate regulation of the evacuation rate of the plasma-processing chamber 100. The evacuation rate through the valve 116 and the incoming gas flow rate from the gas source 154 determine chamber pressure and process gas residency time in the plasma-processing chamber 100.

The gas source 154 is coupled to the plasma-processing chamber 100 via a tube 123 that passes through the chamber lid 124. The tube 123 is fluidly coupled to a plenum 148 between a backing plate 106 and a gas distribution showerhead 128 included in the chamber lid 124. During operation, process gas introduced into the plasma-processing chamber 100 from the gas source 154 fills the plenum 148 and then passes through the gas passages 129 formed in the gas distribution showerhead 128 to uniformly enter the processing region 146. In alternative implementations, process gas may be introduced into the processing region 146 via inlets and/or nozzles (not shown) that are attached to the walls 102 in addition to or in lieu of the gas distribution showerhead 128.

The susceptor 105 may include any technically feasible apparatus for supporting a substrate during processing by the plasma-processing chamber 100, such as the substrate 110 in FIG. 1. In some implementations, the susceptor 105 is disposed on a shaft 112 that is configured to raise and lower the susceptor 105. In one implementation, the shaft 112 and the susceptor 105 may be formed at least in part from or contain an electrically conductive material, such as tungsten, copper, molybdenum, aluminum, or stainless steel. Alternatively or additionally, the susceptor 105 may be formed at least in part from or contain a ceramic material, such as aluminum oxide ($Al_2O_3$), aluminum nitride (AlN), silicon dioxide ($SiO_2$), and the like. In implementations in which the plasma-processing chamber 100 is a capacitively coupled plasma chamber, the susceptor 105 may be configured to contain an electrode 113. In such implementations, a metal rod 115 or other conductor is electrically coupled to the electrode 113 and is configured to provide a portion of a ground path for RF power delivered to the plasma-processing chamber 100. That is, the metal rod 115 enables RF power delivered to the plasma-processing chamber 100 to pass through the electrode 113 and out of the plasma-processing chamber 100 to ground.

In some implementations, the electrode 113 is also configured to provide an electrical bias from a DC power source (not shown) to enable electrostatic clamping of the substrate 110 onto the susceptor 105 during plasma processing. In such implementations, the susceptor 105 generally includes a body including one or more ceramic materials, such as the above-described ceramic materials, or any other ceramic material suitable for use in an electrostatic chuck. In such implementations, the electrode 113 may be a mesh, such as an RF mesh, or a perforated sheet of material made of molybdenum (Mo), tungsten (W), or other material with a coefficient of thermal expansion that is substantially similar to that of the ceramic material or materials included in the body of the susceptor 105. Together, the electrode 113 and the gas distribution showerhead 128 define the boundaries of the processing region 146 in which plasma is formed. For example, during processing, the susceptor 105 and the substrate 110 may be raised and positioned near the lower surface of the gas distribution showerhead 128 (e.g., within 10-30 mm) to form the at least partially enclosed the processing region 146.

The first RF generator 151 is a radio frequency (RF) power source configured to provide high-frequency power at a first RF frequency to a discharge electrode 126 via the RF match 153. Similarly, the second RF generator 152 is an RF power source configured to provide high-frequency power at a second RF frequency to the discharge electrode 126 via RF match 153. In some implementations, first RF generator 151 includes an RF power supply capable of generating RF currents at a high frequency (HF), for example, about 13.56 MHz. Alternatively or additionally, the first RF generator 151 includes a VHF generator capable of generating VHF power, such as VHF power at frequencies between about 20 MHz to 200 MHz or more. By contrast, the second RF generator 152 includes an RF power supply capable of generating RF currents at so-called low frequency (LF) RF, for example, about 350 kHz. Alternatively or additionally, the second RF generator 152 includes an RF generator capable of generating RF power at frequencies between about 1 kHz to about 1 MHz. The first RF generator 151 and the second RF generator 152 are configured to facilitate generation of a plasma between the discharge electrode 126 and the susceptor 105.

The discharge electrode 126 may include a process gas distribution element, such as the gas distribution showerhead 128 (as shown in FIG. 1), and/or an array of gas injection nozzles, through which process gases are introduced into the processing region 146. The discharge electrode 126, i.e., the gas distribution showerhead 128, may be oriented substantially parallel to the surface of the substrate 110, and capacitively couples plasma source power into the processing region 146, which is disposed between the substrate 110 and the gas distribution showerhead 128.

The RF match 153 may be any technically feasible impedance matching apparatus that is coupled between the first RF generator 151 and the powered electrode of the plasma-processing chamber 100, i.e., the gas distribution showerhead 128. The RF match 153 is also coupled between the second RF generator 152 and the powered electrode of the plasma-processing chamber 100. The RF match 153 is configured to match a load impedance (the plasma-processing chamber 100) to the source or internal impedance of a driving source (the first RF generator 151, the second RF generator 152) to enable the maximum transfer of RF power from the first RF generator 151 and the second RF generator 152 to the plasma-processing chamber 100.

Forming a portion of the walls 102 are an upper isolator 107, a tuning ring 108, and a lower isolator 109. The upper isolator 107 is configured to electrically isolate the tuning ring 108, which is formed from an electrically conductive material, from the backing plate 106, which in some implementations is energized with RF power during operation. Thus, upper isolator 107 is positioned between the backing plate 106 and the tuning ring 108, and prevents the tuning ring 108 from being energized with RF power via the backing plate 106. In some implementations, the upper isolator 107 is configured as a ceramic ring or annulus that is positioned concentrically about the processing region 146. Similarly, the lower isolator 109 is configured to electrically isolate the tuning ring 108 from the walls 102. The walls 102 are typically formed from an electrically conductive material, and can therefore act as a ground path for a portion of RF power delivered to the plasma-processing chamber 100 during processing. Thus, the lower isolator 109 enables the tuning ring 108 to be part of a different ground path for RF power delivered to the plasma-processing chamber 100 than that of the walls 102. In some implementations, the upper isolator 107 is configured as a ceramic ring, or is configured to include a ceramic ring that is positioned concentrically about the processing region 146.

The tuning ring 108 is disposed between the upper isolator 107 and the lower isolator 109, is formed from an electrically conductive material, and is disposed adjacent the processing region 146. For example, in some implementations, the tuning ring 108 is formed from a suitable metal, such as aluminum, copper, titanium, or stainless steel. In some implementations, the tuning ring 108 is a metallic ring or annulus that is positioned concentrically about the susceptor 105 and the substrate 110 during processing of the substrate 110. In addition, the tuning ring 108 is electrically coupled to ground via the top RF current tuner 155 via a conductor 156, as shown. Thus, the tuning ring 108 is not a powered electrode, and is generally disposed outside of and around the processing region 146. In one example, the tuning ring 108 is positioned in a plane substantially parallel with the substrate 110, and is part of a ground path for the RF energy used to form a plasma in the processing region 146. As a result, an additional RF ground path 141 is established between the gas distribution showerhead 128 and ground, via the top RF current tuner 155. Thus, by changing the impedance of the top RF current tuner 155 at a particular frequency, the impedance for the RF ground path 141 at that particular frequency changes, causing a change in the RF field that is coupled to the tuning ring 108 at that frequency. Therefore, the shape of plasma in the processing region 146 may be independently modulated along the +/−X and Y-directions for the RF frequency associated with either the first RF generator 151 or the second RF generator 152. That is, the shape, volume or uniformity of the plasma formed in the processing region 146 may be independently modulated for multiple RF frequencies across the surface of the substrate 110 by use, for example, of the tuning ring 108 or vertically between the substrate 110 and the gas distribution showerhead 128 using the electrode 113.

The system controller 158 is configured to control the components and functions of the plasma-processing chamber 100, such as the vacuum pump 114, the first RF generator 151, the second RF generator 152, the RF match 153, the gas source 154, the top RF current tuner 155, and the bottom RF current tuner 157. As such, the system controller 158 receives sensor inputs, e.g., voltage-current inputs from the top RF current tuner 155 and the bottom RF current tuner 157, and transmits control outputs for operation of the plasma-processing chamber 100. The functionality of the system controller 158 may include any technically feasible implementation, including via software, hardware, and/or firmware, and may be divided between multiple separate controllers associated with the plasma-processing chamber 100.

Not to be bound by theory, but it is believed that by delivering different frequencies of RF power to a processing region of a plasma-processing chamber during a plasma enhanced deposition process, the properties of a deposited film can be adjusted. For example, adjusting the low-frequency RF plasma power and/or frequency delivered to the processing region 146, i.e., forming an RF plasma in the 1 kHz to 1 MHz regime, can be beneficial to adjust some deposited film properties, such as film stress, while adjusting the high-frequency RF plasma power and/or frequency delivered to the processing region 146, i.e., forming an RF plasma in the 1 MHz to 200 MHz regime, can be beneficial to adjust other deposited film properties, such as thickness uniformity. According to various implementations of the disclosure, a tuning apparatus enables independent control of the flow of RF current in the plasma-processing chamber 100 at multiple RF frequencies. In some implementations, such a tuning apparatus is employed at multiple locations in the plasma-processing chamber 100, i.e., the top RF current tuner 155 and the bottom RF current tuner 157.

The top RF current tuner 155, as noted above, is electrically coupled to the tuning ring 108 and is terminated to ground, thus providing a controllable RF ground path 141 for the plasma-processing chamber 100. Similarly, the bottom RF current tuner 157 is electrically coupled to the metal rod 115 and is terminated to ground, thus providing a different controllable RF ground path 142 for the plasma-processing chamber 100. As described herein, the top RF current tuner 155 and the bottom RF current tuner 157 are each configured to control the flow of RF current to ground at multiple RF frequencies. Thus, the distribution of RF current at a first RF frequency between the tuning ring 108 and the metal rod 115 can be controlled independently from the distribution of RF current at a second RF frequency between the tuning ring 108 and the metal rod 115.

A plasma 180 is formed in the processing region 146 in between the electrode 113 and the discharge electrode 126. A distance or "spacing" between the bottom surface of the electrode 113 and a top surface of the susceptor 105 is represented by "x".

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc. In one implementation, the boron-carbon film may be deposited using a PRODUCER® XP Precision™ processing system, which is commercially available from Applied Materials, Inc., Santa Clara, California.

The atomic percentage of dopant or inert species incorporation in the amorphous carbon film is calculated as follows: (dopant concentration in $cm^{-3}$ divided by the number of carbon atoms per $cm^{-3}$ expected for a carbon film of a particular density. The amorphous carbon film may contain at least 0.1, 1, or 10 atomic percentage of dopant or inert species. The amorphous carbon film may contain up to 1, 10, or 30 atomic percentage of dopant or inert species. The amorphous carbon film may contain from about 1 to about 30 atomic percentage of dopant or inert species. The amorphous carbon film may contain from about 10 to about 30 atomic percentage of dopant or inert species. The amorphous carbon film may contain at least 3, 5, or 10 atomic percentage of hydrogen. The amorphous carbon film may contain up to 5, 10, or 15 atomic percentage of hydrogen. The amorphous carbon film may contain from about 3 to about 15 atomic percentage of hydrogen.

In one implementation where the dopant is carbon, the atomic percentage of carbon incorporation in the amorphous carbon film is calculated as follows: ((C/(H+C))%). The amorphous carbon film may contain at least 85, 90, or 95 atomic percentage of carbon. The amorphous carbon film may contain up to 90, 95, or 97 atomic percentage of carbon. The amorphous carbon film may contain from about 85 to about 97 atomic percentage of carbon. The amorphous carbon film may contain from about 90 to about 97 atomic percentage of carbon. The amorphous carbon film may contain at least 3, 5, or 10 atomic percentage of hydrogen. The amorphous carbon film may contain up to 5, 10, or 15 atomic percentage of hydrogen. The amorphous carbon film may contain from about 3 to about 15 atomic percentage of hydrogen.

In general, the following exemplary deposition process parameters may be used to for the PECVD portion of the amorphous carbon film deposition process described herein. The process parameters may range from a wafer temperature of about 100 degrees Celsius to about 700 degrees Celsius (e.g., between about 300 degrees Celsius to about 700 degrees Celsius). The chamber pressure may range from about 1 Torr to about 20 Torr (e.g., between about 2 Torr and about 8 Torr; or between about 5 Torr and about 8 Torr). The flow rate of the hydrocarbon-containing gas may be from about 100 sccm to about 5,000 sccm (e.g., between about 100 sccm and about 2,000 sccm; or between about 160 sccm and about 500 sccm). The flow rate of a dilution gas may individually range from about 0 sccm to about 5,000 sccm (e.g., from about 2,000 sccm to about 4,080 sccm). The flow rate of an inert gas may individually range from about 0 sccm to about 10,000 sccm (e.g., from about 0 sccm to about 2,000 sccm; from about 200 sccm to about 2,000 sccm). The RF power may be between 1,000 Watts and 3,000 Watts. The plate spacing between the top surface of the substrate 110 and the gas distribution showerhead 128 may be set to between about 200 mils to about 1,000 mils (e.g., between about 200 mils and about 600 mils; between about 300 mils to about 1,000 mils; or between about 400 mils and about 600 mils). The amorphous carbon film may be deposited to have a thickness between about 10 Å and about 50,000 Å (e.g., between about 300 Å and about 3,000 Å; or between about 500 Å to about 1,000 Å). The above process parameters provide a typical deposition rate for the amorphous carbon film in the range of about 100 Å/minute to about 5,000 Å/minute (e.g., from about 1,400 Å/minute to about 3,200 Å/minute) and can be implemented on a 300 mm substrate in a deposition chamber available from Applied Materials, Inc. of Santa Clara, CA.

The as-deposited amorphous carbon film prior to implantation may have a refractive index (n) (633 nm)) of greater than 1.9, for example approximately 2.2 (e.g., from about 2.1 to about 2.5). The as-deposited amorphous carbon film may have a k-value (k (at 633 nm)) of less than 1.0, for example, (e.g., from about 0.6 to about 0.8). The as-deposited amorphous carbon film may have a Young's modulus (GPa) of from about 50 to about 200 GPa (e.g., from about 60 to about 140 GPa; or from about 100 to about 140 GPa). The as-deposited amorphous carbon film may have a hardness (GPa) of from about 10 GPa to about 22 GPa (e.g., from about 10 GPa to about 15 GPa; or from about 12 GPa to about 14 GPa). The as-deposited amorphous carbon film may have a stress (MPa) of from about −1300 MPa to about 0 MPa (e.g., from about −1300 MPa to about −250 MPa; from about −1250 MPa to about −1000 MPa). The as-deposited amorphous carbon film may have a density (g/cc) from about 1.7 g/cc to about 1.87 g/cc (e.g., from about 1.74 g/cc to about 1.85 g/cc).

The as-deposited amorphous carbon film after carbon implantation may have a refractive index (n) (633 nm)) of greater than 2.04, for example approximately 2.2 (e.g., from about 2.1 to about 2.2). The as-deposited amorphous carbon film may have a k-value (k (at 633 nm)) of less than 1.0, for example, (e.g., from about 0.5 to about 0.8; from about 0.6 to about 0.7). The as-deposited amorphous carbon film after implantation may have a Young's modulus (GPa) of from about 70 to about 200 GPa (e.g., from about 120 to about 180 GPa; or from about 130 to about 170 GPa). The as-deposited amorphous carbon film after implantation may have a hardness (GPa) of from about 14 GPa to about 22 GPa (e.g., from about 15 GPa to about 20 GPa; or from about 16 GPa to about 19 GPa). The as-deposited amorphous carbon film after implantation may have a stress (MPa) of from about −600 MPa to about 0 MPa (e.g., from about −400 MPa to about 0 Pa; from about −350 MPa to about 0 MPa). The as-deposited amorphous carbon film may have a density (g/cc) of greater than 1.9 g/cc, for example approximately 2.1 g/cc (e.g., from about 1.95 g/cc to about 2.1 g/cc).

Figure 2:
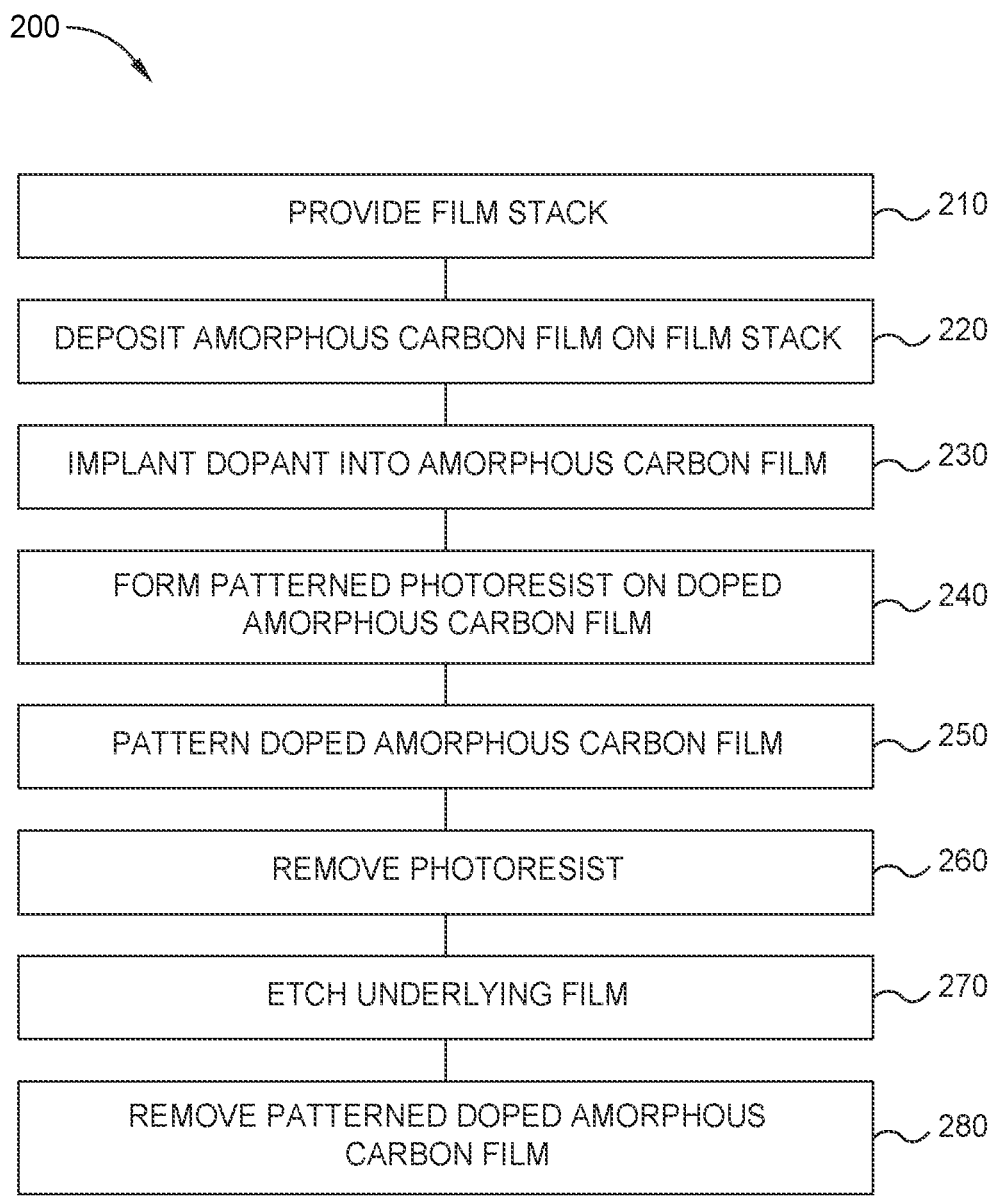
FIG. 2 depicts a process flow diagram of a method for forming an amorphous carbon hardmask layer on a film stack disposed on a substrate in accordance with one or more implementations of the present disclosure.

FIG. 2 depicts a process flow diagram of a method 200 for forming an amorphous carbon hardmask layer on a film stack disposed on a substrate in accordance with one or more implementations of the present disclosure. FIGS. 3A-3H depict a schematic cross-sectional view of a substrate structure illustrating a hardmask formation sequence according to method 200. Although the method 200 is described below with reference to a hardmask layer that may be formed on a film stack utilized to manufacture stair-like structures in the film stack for three dimensional semiconductor devices, the method 200 may also be used to advantage in other device manufacturing applications. Further, it should also be understood that the operations depicted in FIG. 2 may be performed simultaneously and/or in a different order than the order depicted in FIG. 2.

The method 200 begins at operation 210 by positioning a substrate 302, into a process chamber, such as the plasma-processing chamber 100 depicted in FIG. 1. The substrate 302 may be the substrate 110 depicted in FIG. 1. The substrate 302 may be part of a film stack 300 formed thereon.

In one implementation, a surface of the substrate 110, as shown in FIG. 1, is substantially planar. Alternatively, the substrate 110 may have patterned structures, for example, a surface having trenches, holes, or vias formed therein. The substrate 110 may also have a substantially planar surface having a structure formed thereon or therein at a targeted elevation. While the substrate 110 is illustrated as a single body, it is understood that the substrate 110 may contain one or more materials used in forming semiconductor devices such as metal contacts, trench isolations, gates, bitlines, or any other interconnect features. The substrate 110 may comprise one or more metal layers, one or more dielectric materials, semiconductor material, and combinations thereof utilized to fabricate semiconductor devices. For example, the substrate 110 may include an oxide material, a nitride material, a polysilicon material, or the like, depending upon application. In one implementation where a memory application is targeted, the substrate 110 may include the silicon substrate material, an oxide material, and a nitride material, with or without polysilicon sandwiched in between.

In another implementation, the substrate 110 may include a plurality of alternating oxide and nitride materials (i.e., oxide-nitride-oxide (ONO)) (not shown) deposited on the surface of the substrate 110. In various implementations, the substrate 110 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate 110 may be any substrate or material surface upon which film processing is performed. For example, the substrate 110 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low-k dielectrics, and combinations thereof.

The film stack 300 includes the substrate 302 and an underlayer 304. The underlayer 304, as utilized herein, includes any layer, which is disposed beneath an amorphous carbon hardmask. For example, the amorphous carbon hardmask 306 may be disposed directly above the underlayer 304, such that the amorphous carbon hardmask 306 and underlayer 304 are in physical contact with each other. In one implementation, the underlayer 304 includes a single layer. In another implementation, the underlayer 304 includes a dielectric stack.

Figure 3A:
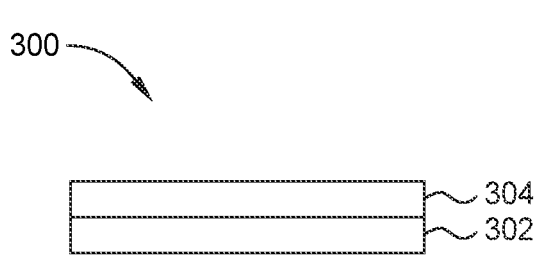
FIGS. 3A-3H depict a schematic cross-sectional view of a substrate structure illustrating a hardmask formation sequence according to one or more implementations of the present disclosure.
Figure 3E:
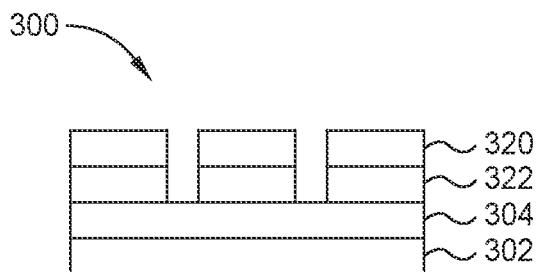
Figure 3B:
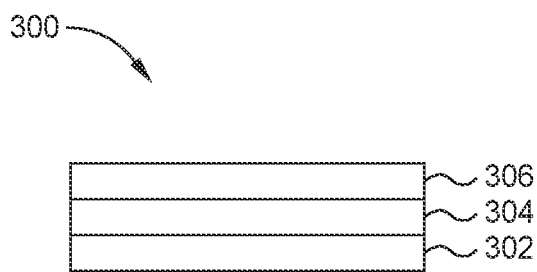

At operation 220, the amorphous carbon hardmask 306 is formed on the underlayer 304 disposed over the substrate 302, as illustrated in FIG. 3B. The amorphous carbon hardmask 306 is deposited by a blanket deposition process over the underlayer 304. In some implementations, the amorphous carbon hardmask 306 is deposited according to the method 400 described in the process flow diagram of FIG. 4. The amorphous carbon hardmask 306 may be deposited to a thickness, which corresponds to the subsequent etching requirements of the underlayer 304. In one example, the amorphous carbon hardmask has a thickness of between about 0.5 µm and about 1.5 µm, such as about 1.0 µm.

Figure 3F:
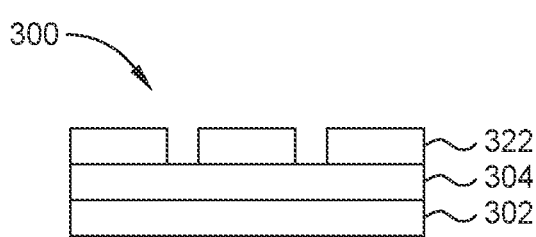
Figure 3C:
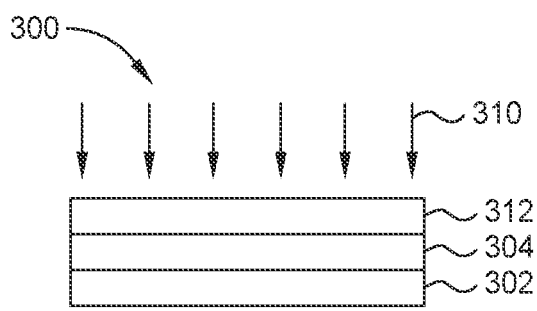

At operation 230, an ion implantation process dopes the amorphous carbon hardmask 306 with a dopant to form a doped amorphous carbon hardmask 312 doped with the dopant, as illustrated in FIG. 3C. Any suitable doping technique may be used. In one implementation, a plasma immersion ion implantation technique is employed to implant dopants or inert species. In one implementation, a beamline implantation technique is employed to implant dopants or inert species. In one implementation, a conformal doping technique, such as a plasma doping (PLAD) technique, may be employed to implant dopants or inert species.

Suitable ion species may be generated from various precursor materials, such as carbon, boron, nitrogen, silicon, phosphorous, helium, argon, neon, krypton, xenon, beryllium, and germanium containing materials. In one implementation, the dopant or inert species is selected from carbon, boron, nitrogen, silicon, phosphorous, argon, helium, neon, krypton, xenon, beryllium, germanium or a combination thereof. Examples of carbon containing precursor gases include $CH_4$. In one implementation, various precursor materials are generated from combinations of precursor materials including, for example, $CH_4/N_2$, $CH_4/He$, $N_2/He$, $CH_4/Ne$, $CH_4/Ar$, $CH_4/Ne$, $CH_4/Kr$, or $CH_4/Xe$.

In the schematic illustration, ions 310 bombard the amorphous carbon hardmask 306 and generally penetrate the amorphous carbon hardmask 306 to form the doped amorphous carbon hardmask 312 implanted with the dopant or inert species. The ions 310 penetrate the amorphous carbon hardmask 306 to various depths depending on the type and size of the ions and the power and bias utilized to energize the ions 310. The species of ions 310 may be tailored to provide increased etch selectivity of the underlayer 304. As such, the implanted species may be any monomer or molecular ion that is adapted to enhance etch selectivity of the amorphous carbon hardmask 306.

The ion implantation process may be performed by beamline or plasma implantation tools. Exemplary systems utilized to perform the implantation process include, for example, the VARIAN VIISta® Trident system, VARIAN VIISta® Thermion system, VARIAN VIISta® medium current Thermion system, VIISta® 3000XP system, VIISta® 900XP system, VIISta® HCP system and the VIISta® PLAD system, available from Applied Materials, Inc., Santa Clara, Calif. Although described with regard to the systems mentioned above, it is contemplated that systems from other manufacturers may also be utilized to perform the ion implantation process.

In one implementation, the ion implantation process implants a dopant or inert species into the amorphous carbon hardmask 306. The dopant or inert species is selected from carbon, boron, nitrogen, silicon, phosphorous, argon, helium, neon, krypton, beryllium, germanium, xenon, or combinations thereof. In one implementation, for 3D NAND applications where carbon hardmask thickness applications are in the range 10 kÅ to 50 kÅ, the implant energy utilized to energize the dopant is between about 60 keV and about 300 keV (single or multiple implant energy may be applied. As an example for carbon implant an energy of 300 keV will modify about 8 kÅ of the carbon hardmask. Multiple implant energies may be applied to modify the carbon hardmask, for example, multiple energies of 60 keV, 120 keV, 180 keV, 240 keV, 300 keV, or some variation. The implant species and multiple energy selection will depend on the type of dopant utilized, the type of material utilized as the amorphous carbon hardmask 306 and the required uniform thickness modification of the carbon hardmask. In another implementation, for DRAM or other technologies such as Logic or emerging memory technologies, where the carbon hardmask thickness may range from 500 Å to 4 kÅ, the implant energy utilized to energize the dopant is between about 1 keV and about 60 keV (e.g., between about 5 keV and about 60 keV; between about 1 keV and about 15 keV; between about 10 keV and about 35 keV; between about 20 keV and about 30 keV; or between about 20 keV and about 25 keV), depending on the type of dopant utilized, the type of material utilized as the amorphous carbon hardmask 306 and the depth of implantation targeted.

In one implementation, for 3D NAND applications where carbon hardmask thickness may be in the range 10 kÅ to 50 kÅ, the ion dosage (ions/$cm^2$) is between about $1\times10^{13}$ ions/$cm^2$ and about $5\times10^{15}$ ions/$cm^2$ (e.g., between about $1\times10^{14}$ ions/$cm^2$ and about $3\times10^{15}$ ions/$cm^2$; between about $5\times10^{14}$ ions/$cm^2$ and about $2\times10^{15}$ ions/$cm^2$) depending on the type of dopant utilized, the type of material utilized as the amorphous carbon hardmask 306 and the depth of implantation targeted. In another implementation, for DRAM or other technologies, for example, Logic or emerging memory technologies, where the carbon hardmask thickness may range from 500 Å to 4 kÅ, the ion dosage (ions/$cm^2$) is between about $5\times10^{13}$ ions/$cm^2$ and about $5\times10^{16}$ ions/$cm^2$ (e.g., between about $1\times10^{14}$ ions/$cm^2$ and about $5\times10^{16}$ ions/$cm^2$; between about $5\times10^{14}$ ions/$cm^2$ and about $2\times10^{16}$ ions/$cm^2$; between about $1\times10^{15}$ ions/$cm^2$ and about $1\times10^{16}$ ions/$cm^2$; depending on the type of dopant utilized, the type of material utilized as the amorphous carbon hardmask 306 and the depth of implantation targeted.

In one implementation, where a PLAD implant technique is used, the implant energy utilized to energize the dopant or inert species is between about 1 kV and about 15 kV (e.g., between about 1 kV and about 15 kV; between about 1 kV and about 15 kV; between about 2 kV and about 12 kV; between about 4 kV and about 10 kV; or between about 20 kV and about 25 kV) at an ion dose range between about $1\times10^{15}$ ions/$cm^2$ and about $5\times10^{17}$ ions/$cm^2$ (e.g., between about $3\times10^{15}$ ions/$cm^2$ and about $3\times10^{17}$ ions/$cm^2$; between about $5\times10^{15}$ ions/$cm^2$ and about $5\times10^{16}$ ions/$cm^2$; between about $5\times10^{15}$ ions/$cm^2$ and about $2\times10^{16}$ ions/$cm^2$; or between about $5\times10^{15}$ ions/$cm^2$ and about $1\times10^{16}$ ions/$cm^2$). In one implementation, where the dopant is helium, the implant energy utilized to energize the dopant is between about 1 kV and about 15 kV at an ion dose range between about $1\times10^{15}$ ions/$cm^2$ and about $3\times10^{17}$ ions/$cm^2$.

In one implementation, the target temperature is between about −100 degrees Celsius and about 550 degrees Celsius (e.g., between about −100 degrees Celsius and about 200 degrees Celsius; between about −100 degrees Celsius and about 0 degrees Celsius; between about −100 degrees Celsius and about 50 degrees Celsius; between about 0 degrees Celsius and about 100 degrees Celsius; or between about 150 degrees Celsius and about 550 degrees Celsius.) In another implementation, the target temperature is between about −100 degrees Celsius and about 500 degrees Celsius (e.g., between about −100 degrees Celsius and about 200 degrees Celsius; between about −100 degrees Celsius and about 0 degrees Celsius; between about −100 degrees Celsius and about 50 degrees Celsius; between about 0 degrees Celsius and about 50 degrees Celsius; or between about 50 degrees Celsius and about 400 degrees Celsius.) In one example, where a cold implant is performed, the target temperature for implantation is from about −100 degrees Celsius to about 0 degrees Celsius. In another example, where a room temperature implant is performed, the target temperature for implantation is from about 10 degrees Celsius to about 100 degrees Celsius. In yet another example, where a hot implant is performed, the target temperature for implantation is from about 150 degrees Celsius to about 550 degrees Celsius.

In general, increased hardness of the amorphous carbon hardmask 306 provides for reduced line bending of high aspect ratio structures in the underlayer 304 after the amorphous carbon hardmask 306 is opened. It is believed that the implanted ions 310 abstract residual hydrogen atoms from the dangling carbon-hydrogen bonds of the amorphous carbon hardmask 306 and form a carbide structure within the amorphous carbon hardmask 306. The carbide structure exhibits increased hardness when compared to an undoped hardmask. Additionally, it is believed the implanted ions 310 occupy interstitial voids present within the amorphous carbon hardmask 306, which results in an increased density of the amorphous carbon hardmask 306. The increased density further increases the mechanical integrity of the amorphous carbon hardmask 306.

In one implementation, subsequent to the ion implantation process, the film stack 300 is thermally treated. Suitable post-ion implant thermal treatment techniques include UV treatment, thermal annealing, and laser annealing. The thermal treatment of the doped amorphous carbon hardmask 312 further incorporates the implanted ions 310 into the framework of the doped amorphous carbon hardmask 312. For example, the implanted ions 310 may be redistributed within the doped amorphous carbon hardmask 312 for form a more uniform doping profile. It is believed the thermal treatment may increase interaction and bonding between the amorphous carbon of the doped amorphous carbon hardmask 312 and the implanted ions 310. The redistribution and bonding of the implanted ions 310 may function to further increase the hardness, density, and etch selectivity of the doped amorphous carbon hardmask 312. In one implementation, the anneal process is performed in a plasma-processing chamber, such as the plasma-processing chamber 100. In another implementation, the anneal process is performed in a separate anneal chamber.

Figure 3G:
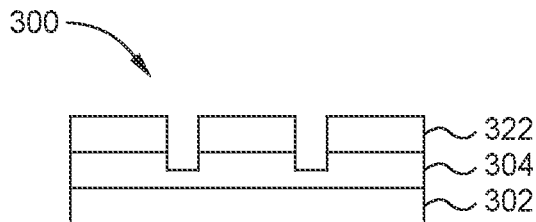
Figure 3D:
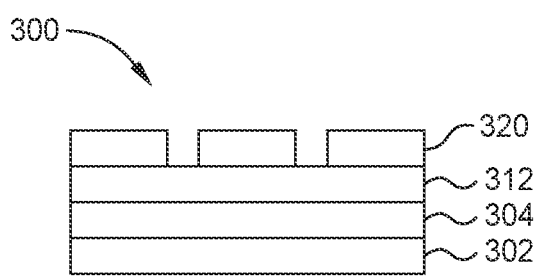
Figure 3H:
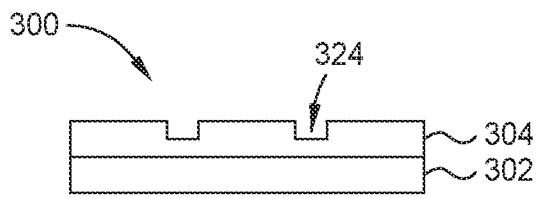

At operation 240, a photoresist layer 320, which is patterned, is formed over the doped amorphous carbon hardmask 312 doped with the dopant or inert species, as illustrated in FIG. 3D. Features or patterns may be transferred to the photoresist layer 320 from a photomask utilizing an energy source, such as light energy. In one implementation, the photoresist layer 320 is a polymeric material and the patterning process is performed by a 193-nanometer immersion photolithography process, or other similar photolithography process. Similarly, lasers may also be utilized to perform the patterning process.

At operation 250, the doped amorphous carbon hardmask 312 is opened by, for example, a plasma etching process to form a doped patterned amorphous carbon hardmask 322 as illustrated in FIG. 3E. The plasma etching process may be performed in a chamber similar to the chambers described with regard to FIG. 3C.

At operation 260, the photoresist layer 320 is removed as illustrated in FIG. 3F. The photoresist layer 320 may be removed by various advantageous photoresist removal processes.

At operation 270, the underlayer 304 is etched, as illustrated in FIG. 3G. The underlayer 304 etching may be performed in a plasma-processing chamber, such as the chambers and systems described with regard to FIG. 1B. Etchants, such as fluorocarbons, remove the exposed portions of the underlayer 304. The active species of the etchants are substantially unreactive with the materials, the implanted ions 310, of the doped patterned amorphous carbon hardmask 322. Thus, the etchants are selective for the underlayer 304 material. Suitable examples of etchants include $CF_4$, $CHF_3$, HBr, $BCl_3$, and $Cl_2$ among others. The etchants may be provided to with an inert carrier gas.

At operation 280, the doped patterned amorphous carbon hardmask 322 is removed. The doped patterned amorphous carbon hardmask 322 may be removed by any advantageous hardmask removal process. In one example, oxygen plasma is utilized to remove the doped patterned amorphous carbon hardmask 322. The resulting film stack 300 includes the underlayer 304 having a feature 324, such as a high aspect ratio feature, formed therein. The film stack 300 may then be subjected to further processing to form a functional semiconductor device.

Figure 4:
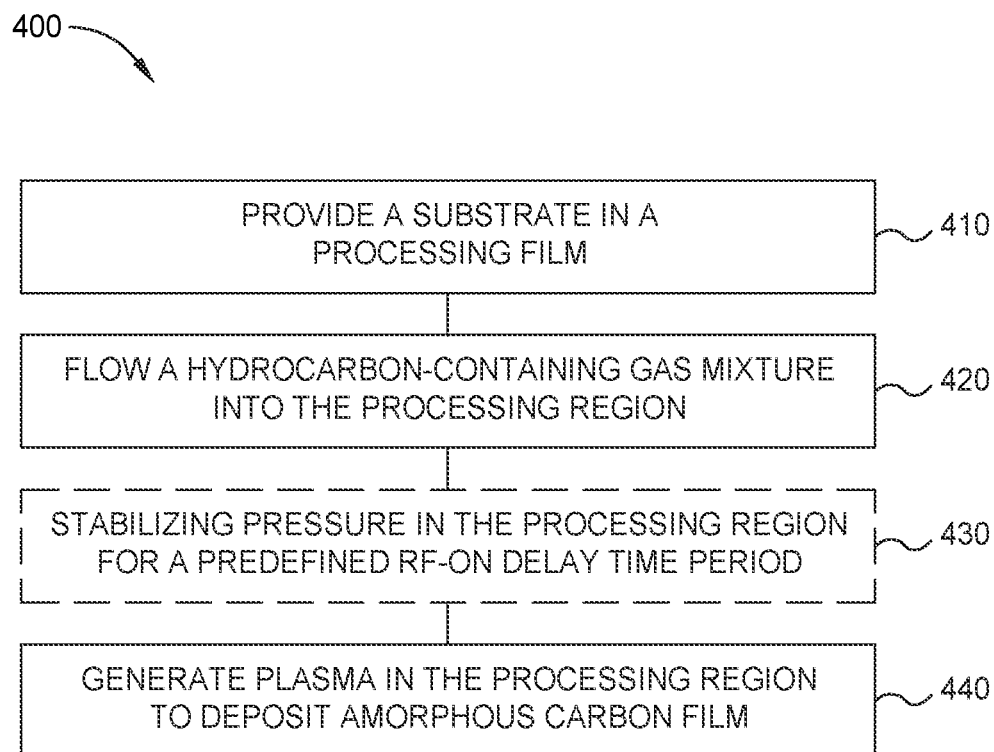
FIG. 4 depicts a process flow diagram of a method for forming an amorphous carbon hardmask layer on a film stack disposed on a substrate in accordance with one or more implementations of the present disclosure.

FIG. 4 is a process flow diagram depicting one implementation of a method 400 for depositing an amorphous carbon film according to implementations described herein. In one implementation, the method 400 may be used to deposit the amorphous carbon film of operation 220. The method 400 begins at operation 410 by providing a substrate in a processing region of a processing chamber. The processing chamber may be the plasma-processing chamber 100 depicted in FIG. 1. The substrate may be substrate 110, also depicted in FIG. 1 or the substrate 302 depicted in FIGS. 3A-3H.

At operation 420, a hydrocarbon-containing gas mixture is flowed into the processing region 146. The hydrocarbon-containing gas mixture may be flowed from the gas source 154 into the processing region 146 through the gas distribution showerhead 128. The gas mixture may include at least one hydrocarbon source and/or carbon-containing source. The gas mixture may further include an inert gas, a dilution gas, a nitrogen-containing gas, or combinations thereof. The hydrocarbon and/or carbon-containing source can be any liquid or gas. In one example, the precursor is vapor at room temperature, which simplifies the hardware for material metering, control and delivery to the chamber.

In one implementation, the hydrocarbon source is a gaseous hydrocarbon, such as a linear hydrocarbon. In one implementation, the hydrocarbon compound has a general formula $C_xH_y$, where x has a range of between 1 and 20 and y has a range of between 1 and 20. In one implementation, the hydrocarbon compound is an alkane. Suitable hydrocarbon compounds include, for example, methane ($CH_4$), acetylene ($C_2H_2$), ethylene ($C_2H_4$), ethane ($C_2H_6$), propylene ($C_3H_6$), and butylenes ($C_4H_8$), cyclobutane ($C_4H_8$), and methylcyclopropane ($C_4H_8$). Suitable butylenes include 1-Butene, 2-Butene, and isobutylene. Other suitable carbon-containing gases include carbon dioxide ($CO_2$) and carbon tetrafluoride ($CF_4$). In one example, $C_3H_6$ is preferable due to formation of more stable intermediate species, which allows more surface mobility.

Suitable dilution gases such as helium (He), argon (Ar), hydrogen ($H_2$), nitrogen ($N_2$), ammonia ($NH_3$), or combinations thereof, among others, may be added to the gas mixture. Ar, He, and $N_2$ are used to control the density and deposition rate of the amorphous carbon layer. In some cases, the addition of $N_2$ and/or $NH_3$ can be used to control the hydrogen ratio of the amorphous carbon layer, as discussed below. Alternatively, dilution gases may not be used during the deposition.

A nitrogen-containing gas may be supplied with the hydrocarbon-containing gas mixture into the plasma-processing chamber 100. Suitable nitrogen-containing compounds include, for example, pyridine, aliphatic amine, amines, nitriles, ammonia and similar compounds.

An inert gas, such as argon (Ar) and/or helium (He) may be supplied with the hydrocarbon-containing gas mixture into the plasma-processing chamber 100. Other inert gases, such as nitrogen ($N_2$) and nitric oxide (NO), may also be used to control the density and deposition rate of the amorphous carbon layer. Additionally, a variety of other processing gases may be added to the gas mixture to modify properties of the amorphous carbon material. In one implementation, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited amorphous carbon layer. The hydrogen ratio present in the amorphous carbon film provides control over layer properties, such as reflectivity.

Optionally, at operation 430, the pressure in the processing region is stabilized for a predefined RF-on delay time-period. The predefined RF-on delay time-period is a fixed time delay defined as the time-period between introduction of the hydrocarbon-containing gas mixture into the processing region and striking or generating the plasma in operation

430. Any suitable fixed time delay may be used to achieve targeted conditions. The length of the RF-on delay time period is typically selected such that the hydrocarbon-containing or carbon-containing gas mixture does not begin to thermally decompose or substantially thermally decompose in the processing region.

At operation 440, RF plasma is generated in the processing region to deposit an amorphous carbon film, such as the amorphous carbon hardmask 306. The plasma may be formed by capacitive or inductive means, and may be energized by coupling RF power into the precursor gas mixture. The RF power may be a dual-frequency RF power that has a high frequency component and a low frequency component. The RF power is typically applied at a power level between about 50 W and about 2,500 W (e.g., between about 2,000 W and about 2,500 W), which may be all high-frequency RF power, for example at a frequency of about 13.56 MHz, or may be a mixture of high-frequency power and low frequency power, for example, at a frequency of about 300 kHz. For most applications, the plasma is maintained for a time period to deposit a an amorphous carbon layer having a thickness between about 100 Å and about 5,000 Å. The flow of hydrocarbon-containing gas mixture may be stopped when a targeted thickness of the amorphous carbon film is reached. The process of operation 440 may be performed simultaneously, sequentially or may partially overlap with the processes of operation 420 and operation 430.

In any of the PECVD implementations described herein, during deposition of the amorphous carbon film, the chamber, the wafer, or both may be maintained at a temperature between about 200 degrees Celsius to about 700 degrees Celsius (e.g., between about 400 degrees Celsius to about 700 degrees Celsius; or between about 500 degrees Celsius to about 700 degrees Celsius). The chamber pressure may range from about 1 Torr to about 10 Torr (e.g., between about 2 Torr and about 8 Torr; or between about 4 Torr and about 8 Torr). The distance between the susceptor and gas distribution showerhead (i.e., "spacing") may be set to between about 200 mils to about 1,000 mils (e.g., between about 200 mils and about 600 mils; between about 300 mils to about 1,000 mils; or between about 400 mils and about 600 mils).

The amorphous carbon film may be deposited to have a thickness between about 10 Å and about 50,000 Å (e.g., between about 300 Å and about 30,000 Å; between about 500 Å to about 1,000 Å)

Any excess process gases and by-products from the deposition of the season layer may then be removed from the processing region by performing an optional purge/evacuation process.

Figure 5A:
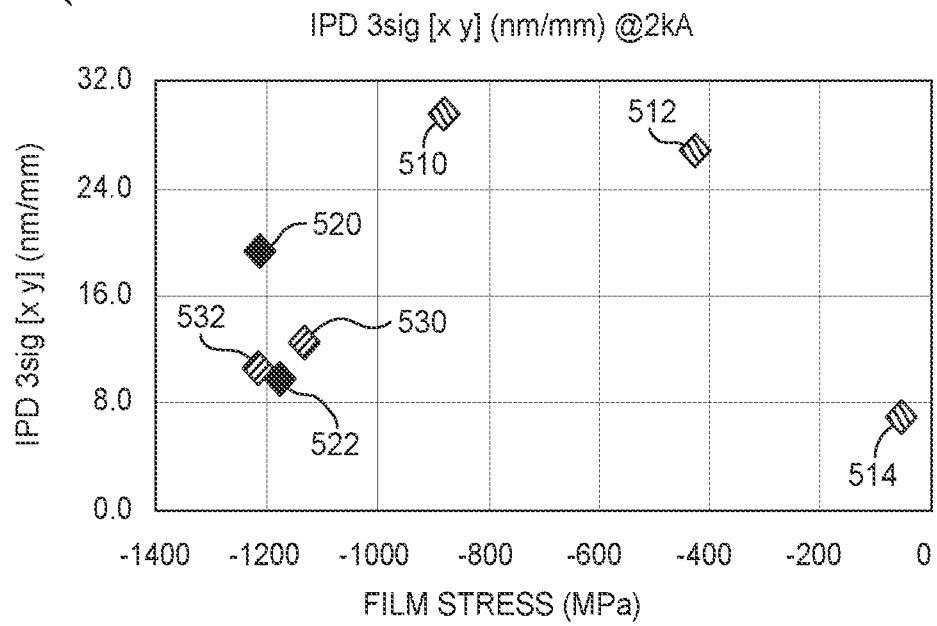
FIG. 5A depicts a plot of in-plane distortion versus film stress (MPa) for amorphous carbon films formed according to implementations of the present disclosure in comparison with amorphous carbon films formed using prior art techniques.
Figure 5B:
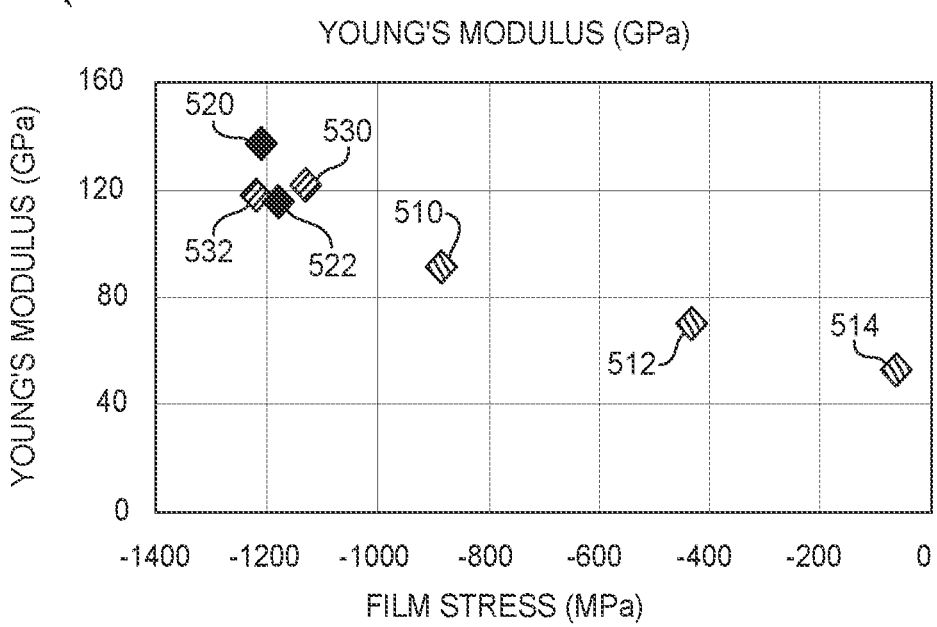
FIG. 5B depicts a plot of Young's Modulus (GPa) versus film stress (MPa) for the amorphous carbon films of FIG. 5A.

FIG. 5A depicts a plot 500 of in-plane distortion versus film stress (MPa) for amorphous carbon films (520, 522 and 530, 532) formed according to implementations of the present disclosure in comparison with amorphous carbon films (510, 512 and 514) formed using prior art techniques. It is noted that the amorphous carbon films (520, 522 and 530, 532) formed according to implementations of the present disclosure are depicted prior to carbon dopant implantations. FIG. 5B depicts a plot 550 of Young's Modulus (GPa) versus film stress (MPa) for the amorphous carbon films of FIG. 5A. As depicted in FIGS. 5A-5B, the amorphous carbon films (520, 522 and 530, 532) formed according to implementations described herein achieved low in-plane distortion and improved modulus despite high stress (e.g., −1200 MPa). The subsequent carbon dopant implantation process described herein reduced the compressive film stress by approximately 4× while increasing the modulus by approximately 1.4×.

Figure 6:
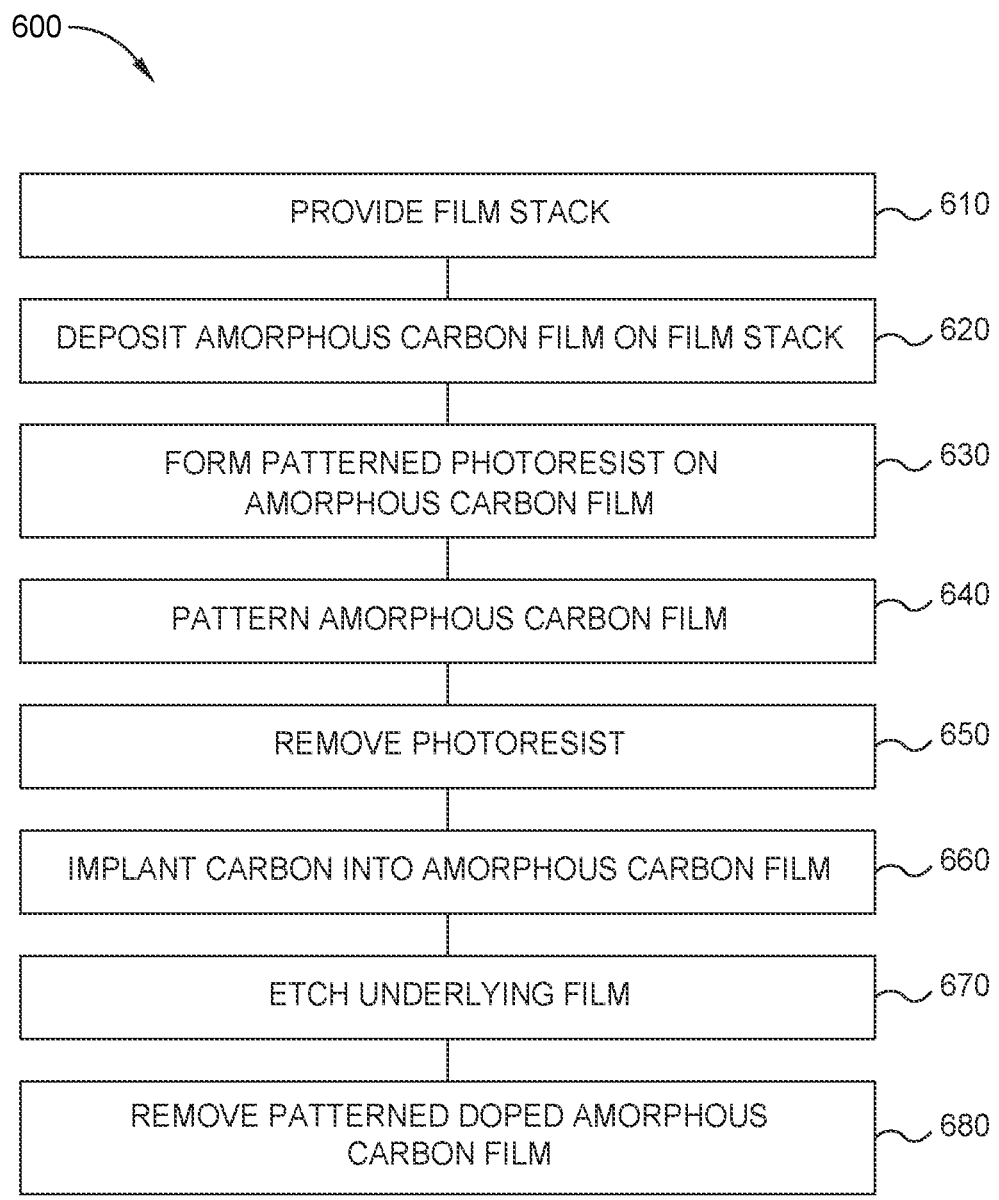
FIG. 6 depicts a process flow diagram of another method for forming an amorphous carbon hardmask layer on a film stack disposed on a substrate in accordance with one or more implementations of the present disclosure.

FIG. 6 depicts a process flow diagram of a method 600 for forming an amorphous carbon hardmask layer on a film stack disposed on a substrate in accordance with one or more implementations of the present disclosure. FIGS. 7A-7I depict a schematic cross-sectional view of a substrate structure illustrating a hardmask formation sequence according to method 600. The method 600 and FIGS. 7A-7I depict a post-patterning implant, where the amorphous carbon film is implanted after patterning the amorphous carbon film. The post-patterning implant can be performed at an implantation tilt angle of zero degrees or at some angle into the amorphous carbon film, with an associated twist angle from 0 to about 360 degrees that enables the ions to only penetrate the hardmask. In one example, for a carbon hardmask line and space feature that runs in one direction and not two perpendicular directions, the implantation is divided into two separate implants, with each implant at one half of the desired dose, so for example, a dose of $1\times10^{16}$ ions/cm$^2$ becomes a dose of $5.0\times10^{15}$ ions/cm$^2$. The substrate experiences implantation every 180 degrees of rotation thus building up to the desired dose of $1\times10^{16}$ ions/cm$^2$. As a result, both sides of the carbon hardmask feature are implanted uniformly. Although the method 200 is described below with reference to a hardmask layer that may be formed on a film stack utilized to manufacture stair-like structures in the film stack for three dimensional semiconductor devices, the method 600 may also be used to advantage in other device manufacturing applications. Further, it should also be understood that the operations depicted in FIG. 6 may be performed simultaneously and/or in a different order than the order depicted in FIG. 6.

The method 600 begins at operation 610 by positioning a substrate 702, into a process chamber, such as the plasma-processing chamber 100 depicted in FIG. 1. The substrate 702 can be the substrate 110 depicted in FIG. 1. The substrate 702 can be part of a film stack 700 having additional layers formed thereon.

In one implementation, a surface of the substrate 702, as shown in FIG. 1, is substantially planar. Alternatively, the substrate 702 may have patterned structures, for example, a surface having trenches, holes, or vias formed therein. The substrate 702 may also have a substantially planar surface having a structure formed thereon or therein at a targeted elevation. While the substrate 702 is illustrated as a single body, it is understood that the substrate 702 may contain one or more materials used in forming semiconductor devices such as metal contacts, trench isolations, gates, bitlines, or any other interconnect features. The substrate 702 may comprise one or more metal layers, one or more dielectric materials, semiconductor material, and combinations thereof utilized to fabricate semiconductor devices. For example, the substrate 702 may include an oxide material, a nitride material, a polysilicon material, or the like, depending upon application. In one implementation, where a memory application is targeted, the substrate 702 may include the silicon substrate material, an oxide material, and a nitride material, with or without polysilicon sandwiched in between.

In another implementation, the substrate 702 may include a plurality of alternating oxide and nitride materials (i.e., oxide-nitride-oxide (ONO)) (not shown) deposited on the surface of the substrate 702. In various implementations, the substrate 702 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate 702 may be any substrate or material surface upon which film processing is performed. For example, the substrate 702 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low-k dielectrics, and combinations thereof.

The film stack 700 includes the substrate 702 and an underlayer 704. The underlayer 704, as utilized herein, includes any layer, which is disposed beneath an amorphous carbon hardmask. For example, the amorphous carbon hardmask 706 may be disposed directly above the underlayer 704, such that the amorphous carbon hardmask 706 and underlayer 704 are in physical contact with each other. In one example, the underlayer 704 includes a single layer. In another example, the underlayer 704 includes multiple layers such as a dielectric stack.

Figure 7A:
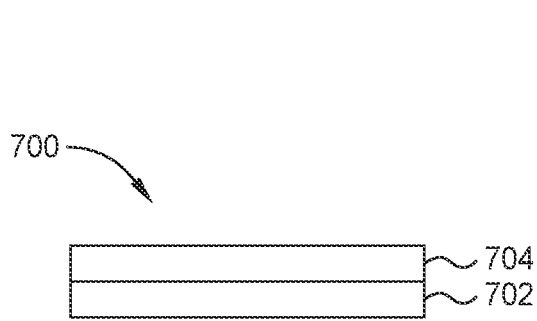
FIGS. 7A-7I depict a schematic cross-sectional view of a substrate structure illustrating a hardmask formation sequence according to one or more implementations of the present disclosure.
Figure 7B:
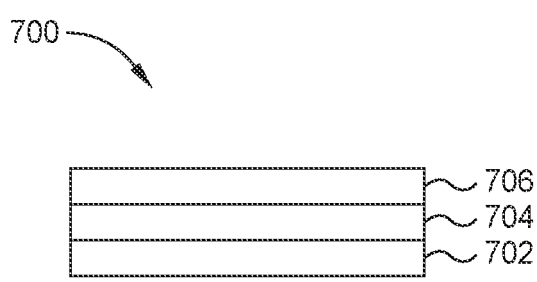

At operation 620, the amorphous carbon hardmask 706 is formed on the underlayer 704 disposed over the substrate 702, as illustrated in FIG. 7B. The amorphous carbon hardmask 706 can be deposited by a blanket deposition process over the underlayer 704. In some implementations, the amorphous carbon hardmask 706 is deposited according to the method 400 described in the process flow diagram of FIG. 4. The amorphous carbon hardmask 706 may be deposited to a thickness, which corresponds to the subsequent etching requirements of the underlayer 704. In one example, the amorphous carbon hardmask has a thickness of between about 0.5 μm and about 1.5 μm, such as about 1.0 μm.

Figure 7C:
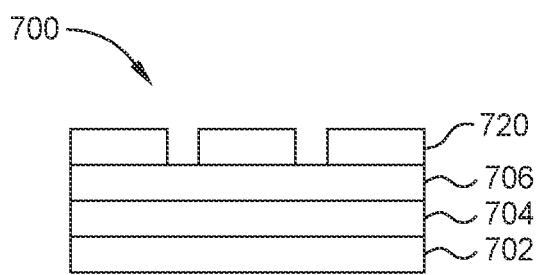

At operation 630, a photoresist layer 720, which is patterned, is formed over the amorphous carbon hardmask 706, as illustrated in FIG. 7C. Features or patterns may be transferred to the photoresist layer 720 from a photomask utilizing an energy source, such as light energy. In one implementation, the photoresist layer 320 is a polymeric material and the patterning process is performed by a 193-nanometer immersion photolithography process, or other similar photolithography process. Similarly, lasers may also be utilized to perform the patterning process.

Figure 7D:
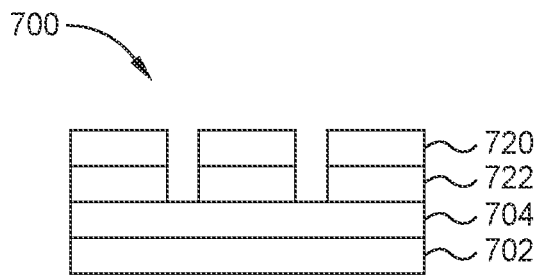

At operation 640, the amorphous carbon hardmask 706 is opened by, for example, a plasma etching process to form a patterned amorphous carbon hardmask 722 having openings or apertures as illustrated in FIG. 7D. Any suitable plasma etching process can be used. In one example, the plasma etching process may be performed in a chamber similar to the chambers described with regard to FIG. 7F.

Figure 7E:
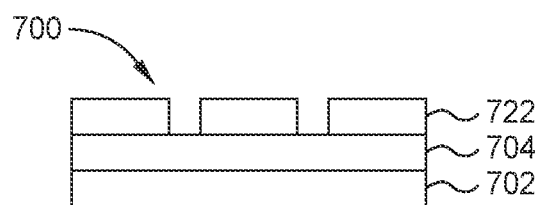

At operation 650, the photoresist layer 720 is removed to exposed a top surface of the patterned amorphous carbon hardmask 722 as illustrated in FIG. 7E. The photoresist layer 320 may be removed by various advantageous photoresist removal processes.

Figure 7F:
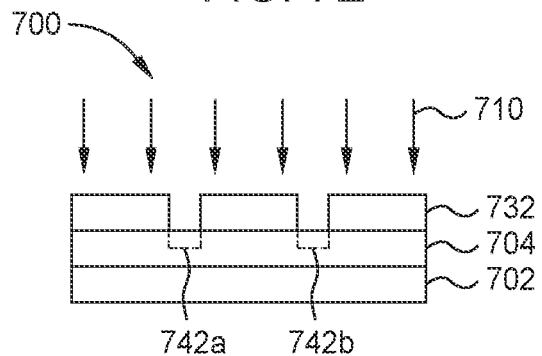
Figure 7G:
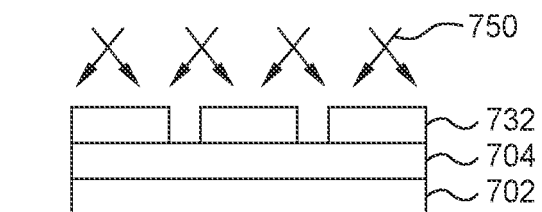

At operation 660, an ion implantation process dopes the patterned amorphous carbon hardmask 722 with a dopant or an inert species to form a doped patterned amorphous carbon hardmask 732 doped with the dopant or inert species, as illustrated in FIG. 7F. The ion implantation process of operation 660 can be performed at either an implantation tilt angle of zero degrees (normal to the plane defined by the top surface of the patterned amorphous carbon hardmask 722) or at an implantation tilt angle greater than zero degrees (±Θ normal to the plane defined by the top surface of the patterned amorphous carbon hardmask 722). As is shown in FIG. 7F, for some ion species that enhance the etch rate of underlayer 704, the implant process can be performed at zero degrees resulting in modified portions 742a and 742b being modified and/or doped. In some examples, the selective modification of the underlayer 704 results in improved etch characteristics of the modified portions 742a, 742b. In another example, for some ion species that result in slowing down the etch rate of the underlayer 704, the ion implantation process can be performed at an implantation tilt angle such that the exposed portions of the underlayer 704 are not modified or doped as shown in FIG. 7G. The implantation tilt angle generally depends on the size of the opening in the patterned amorphous carbon hardmask. The post-patterning implant can be performed at an implantation tilt angle of zero degrees or at some angle into the amorphous carbon film, with an associated twist angle between 0 and 360 degrees that enables the ions to only penetrate the hardmask. The implantation can be divided into multiple implants, with each implant performed at a different tilt angle. The total desired dose can be divided by the multiple implants to determine the dose for each of the multiple implants. For example, for a carbon hardmask line and space feature that runs in one direction and not two perpendicular directions, the implantation can be divided into two separate implants, with each implant at one half of the desired dose, so for example, a dose of $1\times10^{16}$ ions/cm$^2$ becomes a dose of $5.0\times10^{15}$ ions/cm$^2$. The substrate sees implantation every 180 degrees rotation thus building up the desired dose of $1\times10^{16}$ ions/cm$^2$. As a result, both sides of the carbon hardmask feature are implanted uniformly. A wide range of implantation tilt angles are possible, for example, implantation angles from about 0.1 degrees to about 80 degrees (e.g., about 1 degree to about 80 degrees; or from about 10 degrees to about 50 degrees), excluding zero degrees, can be used.

Any suitable doping technique can be used. In one example, a plasma immersion ion implantation technique is employed to implant dopants or inert species. In another example, a beamline implantation technique is employed to implant dopants or inert species. In yet another example, a conformal doping technique, such as a plasma doping (PLAD) technique, is employed to implant dopants or inert species.

Suitable ion species may be generated from various precursor materials, such as carbon, boron, nitrogen, silicon, phosphorous, helium, argon, neon, krypton, xenon, beryllium, and germanium containing materials. In one implementation, the dopant or inert species is selected from carbon, boron, nitrogen, silicon, phosphorous, argon, helium, neon, krypton, xenon, beryllium, germanium, or a combination thereof. Examples of carbon containing precursor gases include $CH_4$. In one implementation, various precursor materials are generated from combinations of precursor materials including, for example, $CH_4/N_2$, $CH_4/He$, $N_2/He$, $CH_4/Ne$, $CH_4/Ar$, $CH_4/Ne$, $CH_4/Kr$, or $CH_4/Xe$.

In the schematic illustration of FIG. 7F, ions 710 bombard the patterned amorphous carbon hardmask 722 at an implantation tilt angle of zero degrees and generally penetrate the patterned amorphous carbon hardmask 722 and exposed portions of the underlayer 704 to form the doped patterned amorphous carbon hardmask 732 and modified portions 742a, 742b, which are modified and/or implanted with the dopant or inert species. The ions 710 penetrate the patterned amorphous carbon hardmask 722 and the underlayer 704 to various depths depending on the type and size of the ions and the power and bias utilized to energize the ions 710. The species of ions 710 can be tailored to provide increased etch selectivity of the underlayer 704. As such, the implanted species can be any monomer or molecular ion that is adapted to enhance etch selectivity of the patterned amorphous carbon hardmask 722.

Alternately, as shown in the schematic illustration of FIG. 7G the implantation process or operation 660 is performed at an angle such that the exposed portions of the underlayer 704 are not modified or doped. The implantation tilt angle depends on the size of the opening. The implantation can further include a twist angle. A wide range of implantation tilt angles are possible, for example, implantation angles from about 0.1 degrees to about 80 degrees (e.g., about 1 degree to about 80 degrees) and from about −0.1 degrees to about −80 degrees (e.g., about −1 degree to about −80 degrees), excluding zero degrees, can be used. The twist angle can be between 0 and 360 degrees, which enables the ions to only penetrate the hardmask. As shown in FIG. 7G, the ions 750 bombard the patterned amorphous carbon hardmask 722 and generally penetrate the patterned amorphous carbon hardmask 722 but generally do not penetrate the exposed portions of the underlayer 704.

The ion implantation process may be performed by beamline or plasma implantation tools. Exemplary systems utilized to perform the implantation process include, for example, the VARIAN VIISta® Trident system, VARIAN VIISta® Thermion system, VARIAN VIISta® medium current Thermion system VIISta® 3000XP system, VIISta® 900XP system, VIISta® HCP system and the VIISta® PLAD system, available from Applied Materials, Inc., Santa Clara, Calif. Although described with regard to the systems mentioned above, it is contemplated that systems from other manufacturers may also be utilized to perform the ion implantation process.

In one implementation, the ion implantation process of operation 660 implants a dopant or inert species into the patterned amorphous carbon hardmask 722. The dopant or inert species is selected from carbon, boron, nitrogen, silicon, phosphorous, argon, helium, neon, krypton, xenon, beryllium, germanium or a combination thereof. In one implementation, the implant energy utilized to energize the dopant is between about 60 keV and about 300 keV (e.g., between about 60 keV and about 300 keV). The implant can be performed at a single energy or multiple energies between 60 keV and 300 keV depending on the type of dopant utilized, the type of material utilized as the patterned amorphous carbon hardmask 722 and the depth of implantation targeted. In another implementation, the implant energy utilized to energize the dopant is between about 1 keV and about 60 keV (e.g., between about 5 keV and about 60 keV; between about 1 keV and about 15 keV; between about 10 keV and about 35 keV; between about 20 keV and about 30 keV; or between about 20 keV and about 25 keV). The implant can be performed at a single energy or multiple energies ranging between 1 keV and 60 keV depending on the type of dopant utilized, the type of material utilized as the patterned amorphous carbon hardmask 722 and the depth of implantation targeted.

In one implementation, the ion dosage (ions/cm$^2$) is between about $1 \times 10^{13}$ ions/cm$^2$ and about $5 \times 10^{17}$ ions/cm$^2$ (e.g., between about $1 \times 10^{15}$ ions/cm$^2$ and about $3 \times 10^{17}$ ions/cm$^2$; between about $1 \times 10^{14}$ ions/cm$^2$ and about $5 \times 10^{16}$ ions/cm$^2$ between about $1 \times 10^{14}$ ions/cm$^2$ and about $2 \times 10^{16}$ ions/cm$^2$; between about $1 \times 10^{15}$ ions/cm$^2$ and about $1 \times 10^{16}$ ions/cm$^2$; between about $5 \times 10^{15}$ ions/cm$^2$ and about $1 \times 10^{16}$ ions/cm$^2$) depending on the type of dopant utilized, the type of material utilized as the amorphous carbon hardmask 306 and the depth of implantation targeted. In another implementation, the ion dosage (ions/cm$^2$) is between about $5 \times 10^{13}$ ions/cm$^2$ and about $5 \times 10^{17}$ ions/cm$^2$ (e.g., between about $1 \times 10^{15}$ ions/cm$^2$ and about $3 \times 10^{17}$ ions/cm$^2$; between about $1 \times 10^{14}$ ions/cm$^2$ and about $5 \times 10^{16}$ ions/cm$^2$; between about $1 \times 10^{14}$ ions/cm$^2$ and about $2 \times 10^{16}$ ions/cm$^2$; between about $1 \times 10^{15}$ ions/cm$^2$ and about $1 \times 10^{16}$ ions/cm$^2$; between about $5 \times 10^{15}$ ions/cm$^2$ and about $1 \times 10^{16}$ ions/cm$^2$) depending on the type of dopant utilized, the type of material utilized as the patterned amorphous carbon hardmask 722 and the depth of implantation targeted.

In one implementation, where a PLAD implant technique is used, the implant energy utilized to energize the dopant or inert species is between about 1 kV and about 15 kV (e.g., between about 1 kV and about 12 kV; between about 2 kV and about 10 kV; at an ion dose range between about $1 \times 10^{15}$ ions/cm$^2$ and about $5 \times 10^{17}$ ions/cm$^2$ (e.g., between about $2 \times 10^{15}$ ions/cm$^2$ and about $3 \times 10^{17}$ ions/cm$^2$; between about $5 \times 10^{15}$ ions/cm$^2$ and about $5 \times 10^{16}$ ions/cm$^2$; or between about $1 \times 10^{16}$ ions/cm$^2$ and about $1 \times 10^{17}$ ions/cm$^2$. In one example, where the dopant is helium, the implant energy utilized to energize the dopant is between about 1 kV and about 15 kV at an ion dose range between about $1 \times 10^{15}$ ions/cm$^2$ and about $3 \times 10^{17}$ ions/cm$^2$.

In one implementation, the target temperature for the implantation process or operation 660 is between about −100 degrees Celsius and about 550 degrees Celsius (e.g., between about −100 degrees Celsius and about 200 degrees Celsius; between about −100 degrees Celsius and about 0 degrees Celsius; between about −100 degrees Celsius and about 50 degrees Celsius; between about 0 degrees Celsius and about 100 degrees Celsius; or between about 150 degrees Celsius and about 550 degrees Celsius.) In another implementation, the target temperature for implantation is between about −100 degrees Celsius and about 500 degrees Celsius (e.g., between about −100 degrees Celsius and about 200 degrees Celsius; between about −100 degrees Celsius and about 0 degrees Celsius; between about −100 degrees Celsius and about 50 degrees Celsius; between about 0 degrees Celsius and about 50 degrees Celsius; or between about 50 degrees Celsius and about 400 degrees Celsius.) In one example, where a cold implant is performed, the target temperature for implantation is from about −100 degrees Celsius to about 0 degrees Celsius. In another example, where a room temperature implant is performed, the target temperature for implantation is from about 10 degrees Celsius to about 100 degrees Celsius. In yet another example, where a hot implant is performed, the target temperature for implantation is from about 150 degrees Celsius to about 550 degrees Celsius.

In one implementation, subsequent to the ion implantation process, the film stack 700 is thermally treated. Suitable post-ion implant thermal treatment techniques include UV treatment, thermal annealing, and/or laser annealing. The thermal treatment of the doped patterned amorphous carbon hardmask 732 further incorporates the implanted ions 710 into the framework of the doped patterned amorphous carbon hardmask 732. For example, the implanted ions 710 may be redistributed within the doped patterned amorphous carbon hardmask 732 to form a more uniform doping profile. It is believed the thermal treatment may increase interaction and bonding between the amorphous carbon of the doped patterned amorphous carbon hardmask 732 and the implanted ions 710. The redistribution and bonding of the implanted ions 710 can function to further increase the hardness, density, and etch selectivity of the doped patterned amorphous carbon hardmask 732. In one implementation, the anneal process is performed in a plasma-processing chamber, such as the plasma-processing chamber 100. In another implementation, the anneal process is performed in a separate anneal chamber.

In general, increased hardness of the doped patterned amorphous carbon hardmask 732 provides for reduced line bending of high aspect ratio structures in the underlayer 704. It is believed that the implanted ions 710, 750 abstract residual hydrogen atoms from the dangling carbon-hydrogen bonds of the amorphous carbon hardmask 706 and form a carbide structure within the amorphous carbon hardmask 706. The carbide structure exhibits increased hardness when compared to an undoped hardmask. Additionally, it is believed the implanted ions 710, 750 occupy interstitial voids present within the doped patterned amorphous carbon hardmask 732, which results in an increased density of the doped patterned amorphous carbon hardmask 732. Additionally, it is believed the implanted ions 710, 750 increase the formation of $SP^3$ carbon to carbon bonds in the amorphous carbon hardmask 706. The increased density further increases the mechanical integrity of the doped patterned amorphous carbon hardmask 732.

Figure 7H:

At operation 670, the underlayer 304 is etched, as illustrated in FIG. 7H. The underlayer 704 etching may be performed in a plasma-processing chamber, such as the chambers and systems described with regard to FIG. 1. Etchants, such as fluorocarbons, remove the exposed portions of the underlayer 704. The active species of the etchants are substantially unreactive with the materials, the implanted ions 710, of the doped patterned amorphous carbon hardmask 732. Thus, the etchants are selective for the underlayer 704 material. Suitable examples of etchants include $CF_4$, $CHF_3$, HBr, $BCl_3$, and $Cl_2$ among others. The etchants may be provided with an inert carrier gas.

Figure 7I:
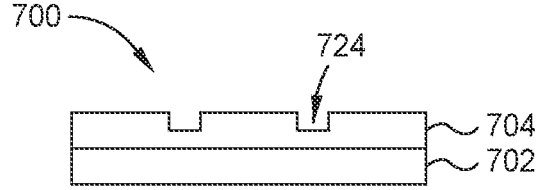

At operation 680, the doped patterned amorphous carbon hardmask 732 is removed as illustrated in FIG. 7I. The doped patterned amorphous carbon hardmask 732 may be removed by any advantageous hardmask removal process. In one example, oxygen plasma is utilized to remove the doped patterned amorphous carbon hardmask 732. The resulting film stack 700 includes the underlayer 704 having a feature 724, such as a high aspect ratio feature, formed therein. The film stack 700 may then be subjected to further processing to form a functional semiconductor device.

The method 200, the method 400, and the method 600 are useful for processes used in the front-end-of-line process (FEOL) prior to metallization process in a semiconductor device manufacturing process. The amorphous carbon film formed by method 400 may serve as a hardmask layer during an etching process due to their high etching selectivity. Suitable processes include gate manufacturing applications, contact structure applications, shallow trench isolation (STI) process, and the like. In some implementations, where the amorphous carbon film is used as an etch stop layer or used as different films for different process purposes, the mechanical or optical properties of the amorphous carbon film may be adjusted as well to meet the particular process need.

Thus, methods for forming a highly etch selective amorphous carbon film having both targeted in-plane distortion and Young's Modulus with low stress are provided by a plasma deposition process followed by a carbon implantation process according to implementations described herein. The methods advantageously provide an amorphous carbon film with targeted mechanical properties, such as low stress and high Young's Modulus, changes in carbon-to-carbon bonding and hydrogen incorporation, as well as high etching selectivity. Implementations of the present disclosure further provide a process design that uses existing hardware with little impact to throughput or implementation cost. Some implementations of the present disclosure provide a unique process that increases the modulus of amorphous carbon films by about 2× (e.g., from about 64 GPa to about 138 GPa) by tuning of the plasma deposition mechanism. Further improvement of film properties is achieved through ion-implantation, which increases the Young's modulus of the amorphous carbon film an additional 30% (e.g., ~180 GPa) while decreasing compressive stress by about 75% (e.g., from about −1200 to about −300 MPa). In addition, the combination of PECVD plus ion implantation delivered amorphous carbon films that achieved significantly lower in-plane distortion (<3 nanometers overlay error) compared to the current generation of pure carbon hardmask films. The resulting film described herein has demonstrated an improvement in etch selectivity of approximately 30-50% compared to the current generation of elementally pure amorphous carbon hardmask films, while also matching the previous overlay requirements.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. An amorphous carbon hardmask comprising:
   an amorphous carbon film, wherein the amorphous carbon film further comprises a carbon dopant implanted into the amorphous carbon film and optionally an additional dopant or inert species selected from boron, nitrogen, nitrogen dimer, silicon, phosphorous, argon, helium, neon, krypton, xenon, beryllium, germanium, or combinations thereof;
   wherein the amorphous carbon hardmask has a Young's modulus (GPa) of from about 70 to about 200 GPa;
   wherein the amorphous carbon hardmask has a stress (MPa) of from about −600 MPa to about 0 MPa; and
   wherein the amorphous carbon film comprises at least 85 atomic percentage of carbon, the carbon dopant comprising at least 1 to 30 atomic percentage of the at least 85 atomic percentage of carbon.

2. The amorphous carbon hardmask of claim 1, wherein the amorphous carbon hardmask has a thickness between about 10 Å and about 50,000 Å.

3. The amorphous carbon hardmask of claim 1, wherein the amorphous carbon hardmask has a hardness of from about 14 GPa to about 22 GPa.

4. The amorphous carbon hardmask of claim 1, wherein the amorphous carbon hardmask has a k-value (at 633 nm) of less than 1.0.

5. The amorphous carbon hardmask of claim 1, wherein the amorphous carbon hardmask has a refractive index (n) (at 633 nm) of greater than 2.04.

6. The amorphous carbon hardmask of claim 1, wherein the amorphous carbon hardmask has a density of greater than 1.9 g/cc.

7. The amorphous carbon hardmask of claim 1, wherein the amorphous carbon hardmask comprises openings or apertures.

8. The amorphous carbon hardmask of claim 1, wherein the the carbon dopant comprises at least 10 to 30 atomic percentage of the at least 85 atomic percentage of carbon.

9. The amorphous carbon hardmask of claim 1, wherein the amorphous carbon hardmask comprises from about 85 to about 97 atomic percentage of carbon.

10. The amorphous carbon hardmask of claim 1, wherein the amorphous carbon hardmask comprises an in-plane distortion of less than 3 nanometers overlay error.

11. A patterned amorphous carbon hardmask comprising:
a patterned amorphous carbon film, wherein the patterned amorphous carbon film further comprises a carbon dopant implanted into the patterned amorphous carbon film and optionally an additional dopant or inert species selected from carbon, boron, nitrogen, nitrogen dimer, silicon, phosphorous, argon, helium, neon, krypton, xenon, beryllium, germanium, or combinations thereof;
wherein the patterned amorphous carbon film has a Young's modulus (GPa) of from about 70 to about 200 GPa;
wherein the patterned amorphous carbon film has a stress (MPa) of from about −600 MPa to about 0 MPa;
wherein the patterned amorphous carbon film comprises a plasma-etched pattern; and
wherein the amorphous carbon hardmask comprises at least 85 atomic percentage of carbon, the carbon dopant comprising at least 1 to 30 atomic percentage of the at least 85 atomic percentage of carbon.

12. The patterned amorphous carbon hardmask of claim 11, wherein the patterned amorphous carbon hardmask further comprises an underlayer disposed beneath the patterned amorphous carbon film.

13. The patterned amorphous carbon hardmask of claim 12, wherein the underlayer is a patterned underlayer.

14. The patterned amorphous carbon hardmask of claim 13, wherein the patterned underlayer comprises the same pattern as the patterned amorphous carbon film.

15. The patterned amorphous carbon hardmask of claim 12, wherein the underlayer comprises a single layer.

16. The patterned amorphous carbon hardmask of claim 12, wherein the underlayer comprises a dielectric stack.

17. An amorphous carbon hardmask comprising:
an amorphous carbon film, wherein the amorphous carbon film further comprises a carbon dopant implanted into the amorphous carbon film and optionally an additional dopant or inert species selected from boron, nitrogen, nitrogen dimer, silicon, phosphorous, argon, helium, neon, krypton, xenon, beryllium, germanium, or combinations thereof,
wherein the amorphous carbon film has a Young's modulus (GPa) of from about 70 to about 200 GPa, a stress (MPa) of from about −600 MPa to about 0 MPa, an in-plane distortion of less than 3 nanometers overlay error, and the amorphous carbon film comprises at least 85 atomic percentage of carbon, the carbon dopant comprising at least 1 to 30 atomic percentage of the at least 85 atomic percentage of carbon; and
an underlayer disposed beneath the amorphous carbon film.

18. The amorphous carbon hardmask of claim 17, wherein the amorphous carbon film has a thickness between about 10 Å and about 50,000 Å.

19. The amorphous carbon hardmask of claim 17, wherein the amorphous carbon film has a hardness of from about 14 GPa to about 22 GPa.

20. The amorphous carbon hardmask of claim 17, wherein the amorphous carbon film and the underlayer are patterned, and wherein the patterned amorphous carbon film and the patterned underlayer comprise the same pattern.

* * * * *